United States Patent [19]
Horie et al.

[11] Patent Number: 6,054,887
[45] Date of Patent: Apr. 25, 2000

[54] OFFSET VOLTAGE CORRECTION CIRCUIT

[75] Inventors: Masakiyo Horie, Gamagoori; Takuya Harada, Kariya, both of Japan

[73] Assignee: Denso Corporation, Kariya, Japan

[21] Appl. No.: 09/112,284

[22] Filed: Jul. 9, 1998

[30] Foreign Application Priority Data

| Jul. 9, 1997 | [JP] | Japan | ................................... | 9-184161 |
| May 7, 1998 | [JP] | Japan | ................................. | 10-124942 |

[51] Int. Cl.[7] .................................................. H03L 5/00
[52] U.S. Cl. ........................ 327/307; 327/309; 327/312; 327/560; 327/563
[58] Field of Search .................................. 327/307, 309, 327/312, 315, 316, 362, 363, 560, 561, 562, 563; 330/252, 254

[56] References Cited

U.S. PATENT DOCUMENTS

| 4,581,585 | 4/1986 | Bristol | ..................................... | 327/134 |
|---|---|---|---|---|
| 5,030,850 | 7/1991 | Lunsford | ................................... | 327/72 |
| 5,260,614 | 11/1993 | Theus et al. | ............................. | 327/362 |
| 5,359,238 | 10/1994 | Lesko | ....................................... | 327/72 |
| 5,767,545 | 6/1998 | Takahashi | ............................... | 257/341 |

FOREIGN PATENT DOCUMENTS 5-129848A  5/1993  Japan.

*Primary Examiner*—Timothy P. Callahan
*Assistant Examiner*—An T. Luu
*Attorney, Agent, or Firm*—Pillsbury Madison & Sutro LLP

[57] ABSTRACT

An offset voltage correction circuit for an operational amplifier (1) includes an offset voltage varying device (16, 17, 20, 21–23) for varying an offset voltage in the operational amplifier (1) in response to an offset voltage control value. A comparing device (25) operates for comparing an output voltage from the operational amplifier (1) with a prescribed reference voltage. A control device (19, 300) operates for outputting the offset voltage control value to the offset voltage varying device, for changing the offset voltage control value, for storing, in response to a result of the comparing by the comparing device (25), a digital signal representative of the offset voltage control value at which the output voltage from the operational amplifier (1) and the prescribed reference voltage are equal, and for correcting the offset voltage in the operational amplifier (1) in response to the stored digital signal.

10 Claims, 11 Drawing Sheets

OFFSET VOLTAGE CORRECTION CIRCUIT

BACKGROUND OF THE INVENTION

1. Field of the Invention

This invention relates to an offset voltage correction circuit for an operational amplifier.

2. Description of the Related Art

An offset voltage in an operational amplifier tends to vary in accordance with a temperature change. Also, the offset voltage tends to vary as parameters of the components of the operational amplifier changes through time in accordance with ageing-based changes in parameters of parts. It is known that during the manufacture of an operational amplifier, the operational amplifier is adjusted by a trimming device for offset voltage correction.

Japanese published unexamined patent application 5-129848 discloses an offset voltage compensating circuit for a differential amplifier. The circuit of Japanese application 5-129848 includes a short-circuiting switch SW1 to set input terminals of a differential amplifier at the same voltage, capacitors Cl and C2 connected to a node to change the output voltage of the differential amplifier, and charge/discharge switches SW3–SW6 to connect the capacitors Cl and C2 to a charging source or a discharging source. Also, the circuit of Japanese application 5-129848 includes a comparator and a switch control circuit. The comparator operates to compare an output voltage from the differential amplifier with a prescribed reference voltage. The switch control circuit operates the short-circuiting switch SW1 when receiving a compensation starting signal. The switch control circuit operates the charge/discharge switches SW3–SW6 in response to an output signal of the comparator so that the output voltage of the differential amplifier can be coincident with the prescribed reference voltage.

In the circuit of Japanese application 5-129848, charges in the capacitors C1 and C2 form balance voltages for offset voltage compensation. The capacitors C1 and C2 tend to be naturally discharged as time goes by. Accordingly, the circuit of Japanese application 5-129848 is repetitively activated to implement offset voltage compensation while the differential amplifier is used for a long term.

SUMMARY OF THE INVENTION

It is an object of this invention to provide an improved offset voltage correction circuit for an operational amplifier.

A first aspect of this invention provides an offset voltage correction circuit for an operational amplifier (1) which comprises an offset voltage varying element (16, 17, 20, 21–23) for varying an offset voltage in the operational amplifier (1) in response to an offset voltage control value; a comparing element (25) for comparing an output voltage from the operational amplifier (1) with a prescribed reference voltage; and a control element (19, 300) for outputting the offset voltage control value to the offset voltage varying element, for changing the offset voltage control value, for storing, in response to a result of the comparing by the comparing element (25), a digital signal representative of the offset voltage control value at which the output voltage from the operational amplifier (1) and the prescribed reference voltage are equal, and for correcting the offset voltage in the operational amplifier (1) in response to the stored digital signal.

A second aspect of this invention provides an offset voltage correction circuit for an operational amplifier (80) having a phase compensation capacitor (14), the circuit comprising a switch means (84, 85) for disconnecting the phase compensation capacitor (14) from a remaining portion of the operational amplifier (80) to enable the operational amplifier (80) to serve as a comparator; an offset voltage varying element (16, 17, 20, 21–23) for varying an offset voltage in the operational amplifier (80) in response to an offset voltage control value; and a control element (19, 300) for outputting the offset voltage control value to the offset voltage varying element, for changing the offset voltage control value, for storing a digital signal representative of the offset voltage control value at which an output level from the operational amplifier (80) changes, and for correcting the offset voltage in the operational amplifier (80) in response to the stored digital signal.

A third aspect of this invention is based on the second aspect thereof, and provides an offset voltage correction circuit wherein the switch circuit comprises switches connected to opposite ends of the phase compensation capacitor (14) respectively.

A fourth aspect of this invention is based on the first aspect thereof, and provides an offset voltage correction circuit wherein an output terminal of the operational amplifier (1) and an inverting input terminal of the operational amplifier (1) are electrically connected to each other, and the prescribed reference voltage is applied to a non-inverting input terminal (4) of the operational amplifier (1).

A fifth aspect of this invention is based on the first aspect thereof, and provides an offset voltage correction circuit wherein the prescribed reference voltage is applied to a non-inverting input terminal (4) of the operational amplifier (1) when the offset voltage varying element (16, 17, 20, 21–23) varies the offset voltage in the operational amplifier (1).

A sixth aspect of this invention is based on the first aspect thereof, and provides an offset voltage correction circuit wherein the offset voltage varying element (16, 17, 20, 21–23) comprises a first transistor (16) connected to a non-inverting input portion of the operational amplifier (1), the non-inverting input portion having a non-inverting input terminal (4) of the operational amplifier (1); a second transistor (17) connected to an inverting input portion of the operational amplifier (1), the inverting input portion having an inverting input terminal (2) of the operational amplifier (1); a digital-to-analog converter (20) for generating a voltage in response to the offset voltage control value outputted from the control element (19, 300); and constant voltage generator for generating a constant voltage (VDD); wherein the voltage generated by the digital-to-analog converter (20) is applied to a gate of one of the first and second transistors (16, 17), and the constant voltage (VDD) generated by the constant voltage generating means is applied to a gate of the other of the first and second transistors (16, 17) to vary the offset voltage in response to the voltage generated by the digital-to-analog converter (20).

A seventh aspect of this invention is based on the sixth aspect thereof, and provides an offset voltage correction circuit wherein the control element (19, 300) comprises a counter (41, 201) for providing a count value being the offset voltage control value, and the voltage generated by the digital-to-analog converter (2) depends on the count value provided by the counter (41, 201).

An eighth aspect of this invention is based on the sixth aspect thereof, and provides an offset voltage correction circuit wherein the voltage generated by the digital-toanalog converter (20) monotonically varies in accordance with the count value provided by the counter (41); one of a maximum value and a minimum value of the voltage generated by the digital-to-analog converter (20) is equal to the constant voltage (VDD) generated by the constant voltage generator means; and the counter (41) operates to change an offset corrective amount from an upper limit value to an intermediate value, and then exchange the voltages applied to the gates of the first and second transistors (16, 17) and change the offset corrective amount from the intermediate value to a lower limit value.

A ninth aspect of this invention is based on the sixth aspect thereof, and provides an offset voltage correction circuit wherein the control element (19, 300) comprises a first counter (101) for providing a count value corresponding to the offset voltage control value, and a second counter (201) for providing a count value corresponding to the offset voltage control value; the digital-to-analog converter (20) selects one of the count values provided by the first and second counters (101, 201), and generates a voltage in response to the selected count value; during offset voltage detection, the digital-to-analog converter (20) selects the count value provided by the first counter (101), and the voltages applied to the gates of the transistors (16, 17) are exchanged when the count value provided by the first counter (101), which operates in an up count mode, reaches an upper limit value, and then the first counter (101) operates in a down count mode until the count value provided by the first counter (101) reaches a lower limit value; the second counter (201) implements counting in response to the result of the comparing by the comparing element (25); the second counter (201) stores the count value provided by the second counter (201); after the offset voltage detection ends, the digital-to-analog converter (20) selects the count value provided by the second counter (201), and the digital-to-analog converter (20) generates a voltage in response to the count value stored by the second counter (201).

A tenth aspect of this invention is based on the sixth aspect thereof, and provides an offset voltage correction circuit wherein the control element (300) comprises a register (300) for controlling the offset voltage control value outputted to the digital-to-analog converter (20).

An eleventh aspect of this invention is based on the first aspect thereof, and provides an offset voltage correction circuit further comprising a switch circuit; a voltage holding element connected to an output terminal of the operational amplifier (1) via the switch element for holding the output voltage from the operational amplifier (1); a switch setting circuit for, during a sampling process, turning the switch circuit on to output the output voltage from the operational amplifier (1); and a switch setting circuit for, during a hold process, turning the switch circuit in off to output the output voltage from the operational amplifier (1) which occurs immediately before the switch circuit is turned off.

A twelfth aspect of this invention provides an offset voltage correction circuit for an operational amplifier which comprises a first element for applying a prescribed reference voltage to an input terminal of the operational amplifier; a second element for applying an offset corrective voltage to the operational amplifier; a third element for generating a digital signal, and periodically updating the generated digital signal; a fourth element for varying the offset corrective voltage applied to the operational amplifier in response to the digital signal generated and periodically updated by the third means; a fifth element for comparing an output voltage from the operational amplifier with the prescribed reference voltage applied to the input terminal of the operational amplifier to detect that the output voltage from the operational amplifier reaches the prescribed reference voltage while the fourth element varies the offset corrective voltage; and a sixth element for inhibiting the third element from updating the digital signal when the fifth element detects that the output voltage from the operational amplifier reaches the prescribed reference voltage.

A thirteenth aspect of this invention provides an offset voltage correction circuit for an operational amplifier which comprises first a element for applying a prescribed reference voltage to an input terminal of the operational amplifier; a second element for applying an offset corrective voltage to the operational amplifier; a signal generator for generating a clock pulse signal; a counter connected to the signal generator for counting pulses of the clock pulse signal, and generating a digital signal representative of a result of the counting; a fourth element for varying the offset corrective voltage applied to the operational amplifier in response to the digital signal generated by the counter; a fifth element for comparing an output voltage from the operational amplifier with the prescribed reference voltage applied to the input terminal of the operational amplifier to detect that the output voltage from the operational amplifier reaches the prescribed reference voltage while the fourth means varies the offset corrective voltage; and a sixth element for blocking feed of the clock pulse signal from the signal generator to the counter when the fifth means detects that the output voltage from the operational amplifier reaches the prescribed reference voltage.

DESCRIPTION OF THE PREFERRED EMBODIMENTS

First Embodiment

Figure 1:
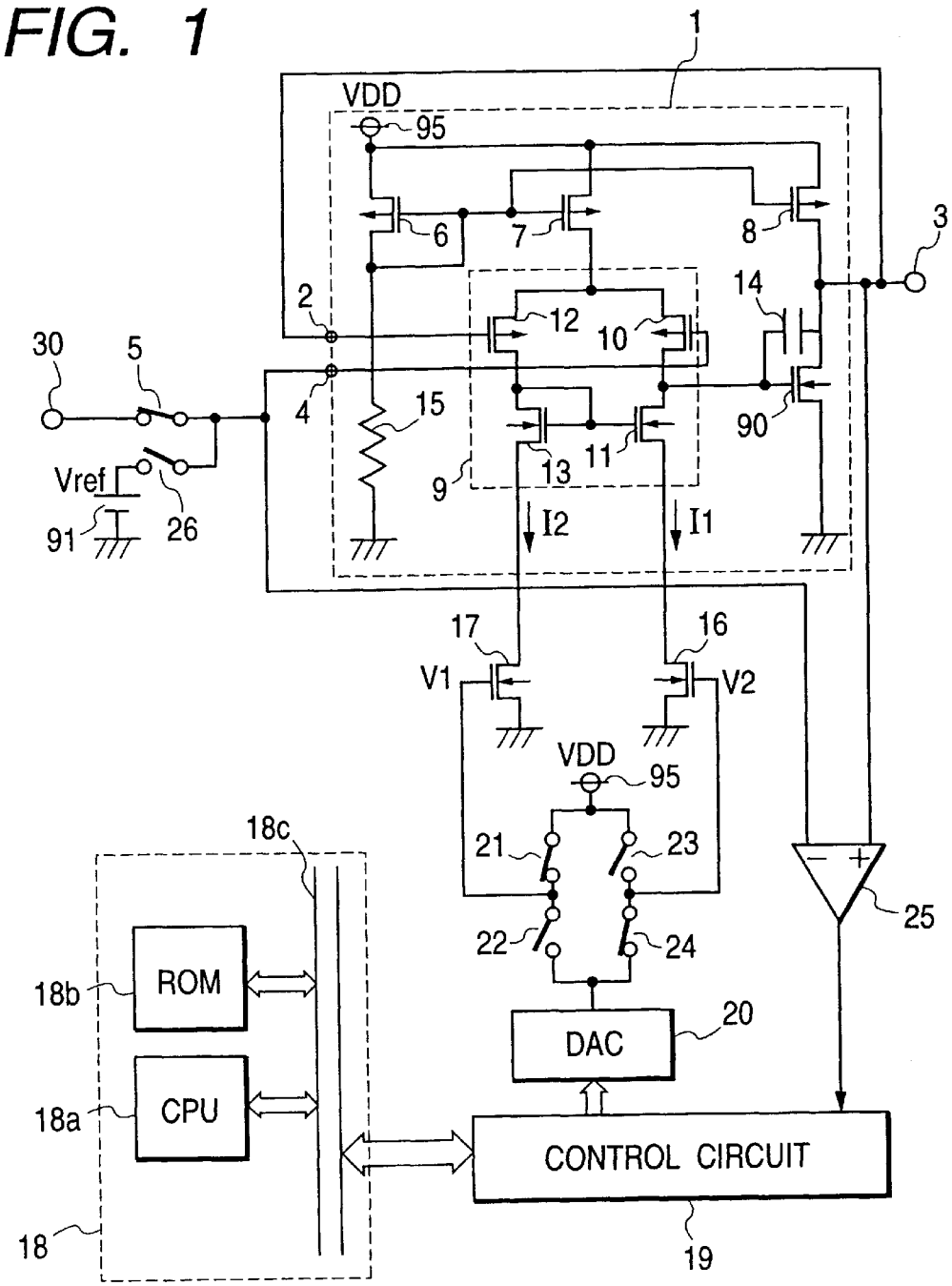
FIG. 1 is a diagram of an offset voltage correction circuit and an operational amplifier according to a first embodiment of this invention.

FIG. 1 shows an offset voltage correction circuit which operates on an operational amplifier 1. The offset voltage correction circuit of FIG. 1 is based on a first embodiment of this invention. The offset voltage correction circuit of FIG. 1 has a function of correcting an offset voltage in the operational amplifier 1.

Figure 2:
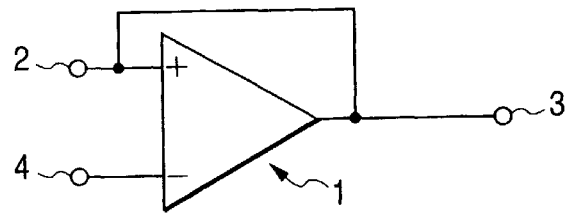
FIG. 2 is a diagram of the operational amplifier in FIG. 1.

With reference to FIGS. 1 and 2, the operational amplifier 1 has an inverting input terminal 2, and an output terminal 3 which is connected to the input terminal 2. The operational amplifier 1 is used as a buffer amplifier.

The operational amplifier 1 has a non-inverting input terminal 4 connected via a switch 5 to an input terminal 30. During normal use of the operational amplifier 1 for which the decision of a desired offset corrective voltage remains unexecuted, the switch 5 is in an on state (a closed state) and an input signal is transmitted to the non-inverting input terminal 4 of the operational amplifier 1 via the input terminal 30 and the switch 5.

The operational amplifier 1 includes a differential amplifier circuit 9. The differential amplifier circuit 9 has P-channel MOS transistors 10 and 12 as input transistors. The differential amplifier circuit 9 has N-channel MOS transistors 11 and 13 as load transistors.

The operational amplifier 1 also includes P-channel MOS transistors 6, 7, and 8, a capacitor 14, a resistor 15, and an N-channel MOS transistor 90.

The source of the transistor 6 is connected to a positive power feed line 95 subjected to a positive constant power supply voltage VDD (equal to for example, 5 V). The drain of the transistor 6 is grounded via the resistor 15. The gate of the transistor 6 is connected to the drain thereof. The source of the transistor 7 is connected to the positive power feed line 95. The gate of the transistor 7 is connected to the gate of the transistor 6. The drain of the transistor 7 is connected to the sources of the transistors 10 and 12. The source of the transistor 8 is connected to the positive power feed line 95. The gate of the transistor 8 is connected to the gates of the transistors 6 and 7. The drain of the transistor 8 is connected to the output terminal 3, a first end of the capacitor 14, and the drain of the transistor 90. A second end of the capacitor 14 is connected to the gate of the transistor 90. The source of the transistor 90 is grounded. The gate of the transistor 90 is connected to the drains of the transistors 10 and 11.

The gate of the transistor 10 is connected to the non-inverting input terminal 4. The gate of the transistor 12 is connected to the inverting input terminal 2. The drain of the transistor 10 is connected to the drain of the transistor 11. The gate of the transistor 11 is connected to the gate of the transistor 13. The source of the transistor 11 is connected to the offset voltage correction circuit. The drain of the transistor 12 is connected to the drain of the transistor 13. The drain of the transistor 13 is connected to the gate thereof. The source of the transistor 13 is connected to the offset voltage correction circuit.

During operation of the differential amplifier circuit 9 within the operational amplifier 1, currents I1 and I2 flowing through the respective transistors 11 and 13 vary in accordance with the difference between voltages at the gates of the transistors 10 and 12. The capacitor 14 operates for phase compensation (suppression of parasitic oscillation).

The offset voltage correction circuit includes N-channel MOS transistors 16 and 17. The drain of the transistor 16 is connected to the source of the transistor 11 within the operational amplifier 1. The source of the transistor 16 is grounded. The drain of the transistor 17 is connected to the source of the transistor 13 within the operational amplifier 1. The source of the transistor 17 is grounded. As will be made clear later, voltages V1 and V2 at the gates of the transistors 16 and 17 are adjusted to decide a desired offset corrective voltage.

The offset voltage correction circuit includes a microcomputer 18, a control circuit 19, a digital-to-analog converter 20, switches 21, 22, 23, and 24, a comparator 25, a switch 26, and a dc power source 91. Preferably, the comparator 25 is of the chopper type, being capable of canceling an offset voltage therein.

The microcomputer 18 includes a CPU 18a, a ROM 18b, and a bus 18c. The CPU 18a and the ROM 18b are connected via the bus 18c. The CPU 18a operates in accordance with a program stored in the ROM 18b. The control circuit 19 is connected to the bus 18c within the microcomputer 18. The input terminal of the digital-to-analog converter 20 is connected to the control circuit 19. The output terminal of the digital-to-analog converter 20 is connected via the switch 22 to the gate of the transistor 17. Also, the output terminal of the digital-to-analog converter 20 is connected via the switch 24 to the gate of the transistor 16. The positive power feed line 95 is connected via the switch 21 to the gate of the transistor 17. Also, the positive power feed line 95 is connected via the switch 23 to the gate of the transistor 16. A first input terminal of the comparator 25 is connected to the output terminal 3 of the operational amplifier 1. A second input terminal of the comparator 25 is connected to the non-inverting input terminal 4 of the operational amplifier 1. The output terminal of the comparator 25 is connected to the control circuit 19.

The switches 21–24 include H-bridge combinations of MOS transistors. The switches 21–24 have control terminals subjected to a common 1-bit switch control signal. When the switch control signal assumes a low-level state, the switches 21 and 24 change to on states (closed states) and the switches 22 and 23 change to off states (open states). Therefore, in this case, the output signal of the digital-to-analog converter 20 is applied to the gate of the transistor 16 while the positive power supply voltage VDD is applied to the gate of the transistor 17. When the switch control signal assumes a high-level state, the switches 22 and 23 change to on states (closed states) and the switches 21 and 24 change to off states (open states). Therefore, in this case, the output signal of the digital-to-analog convert 20 is applied to the gate of the transistor 17 while the positive power supply voltage VDD is applied to the gate of the transistor 16.

The positive terminal of the dc power source 91 is connected via the switch 26 to the non-inverting input terminal 4 of the operational amplifier 1. The negative terminal of the dc power source 91 is grounded. The dc power source 91 generates a prescribed reference voltage Vref. During normal use of the operational amplifier 1 for which the decision of a desired offset corrective voltage remains unexecuted, the switch 26 remains in an off state (an open state) while the switch 5 remains in its on state (its closed state). Accordingly, in this case, an input signal is transmitted to the non-inverting input terminal 4 of the operational amplifier 1 via the input terminal 30 and the switch 5. During the execution of the decision of the desired offset corrective voltage, the switch 5 remains in its off state (its open state) while the switch 26 remains in its on state (its closed state). Accordingly, in this case, the prescribed reference voltage Vref is applied to the non-inverting input terminal 4 of the operational amplifier 1 via the switch 26.

The switches 5 and 26 include, for example, analog switches. The switches 5 and 26 have control terminals subjected to a common 1-bit switch control signal. When the switch control signal assumes a high-level state, the switch 5 changes to its off state (its open state) and the switch 26 changes to its on state (its closed state). When the switch control signal assumes a low-level state, the switch 5 changes to its on state (its closed state) and the switch 26 changes to its off state (its open state). The control signal for the switches 5 and 26 is also referred to as the correction term signal.

Figure 3:
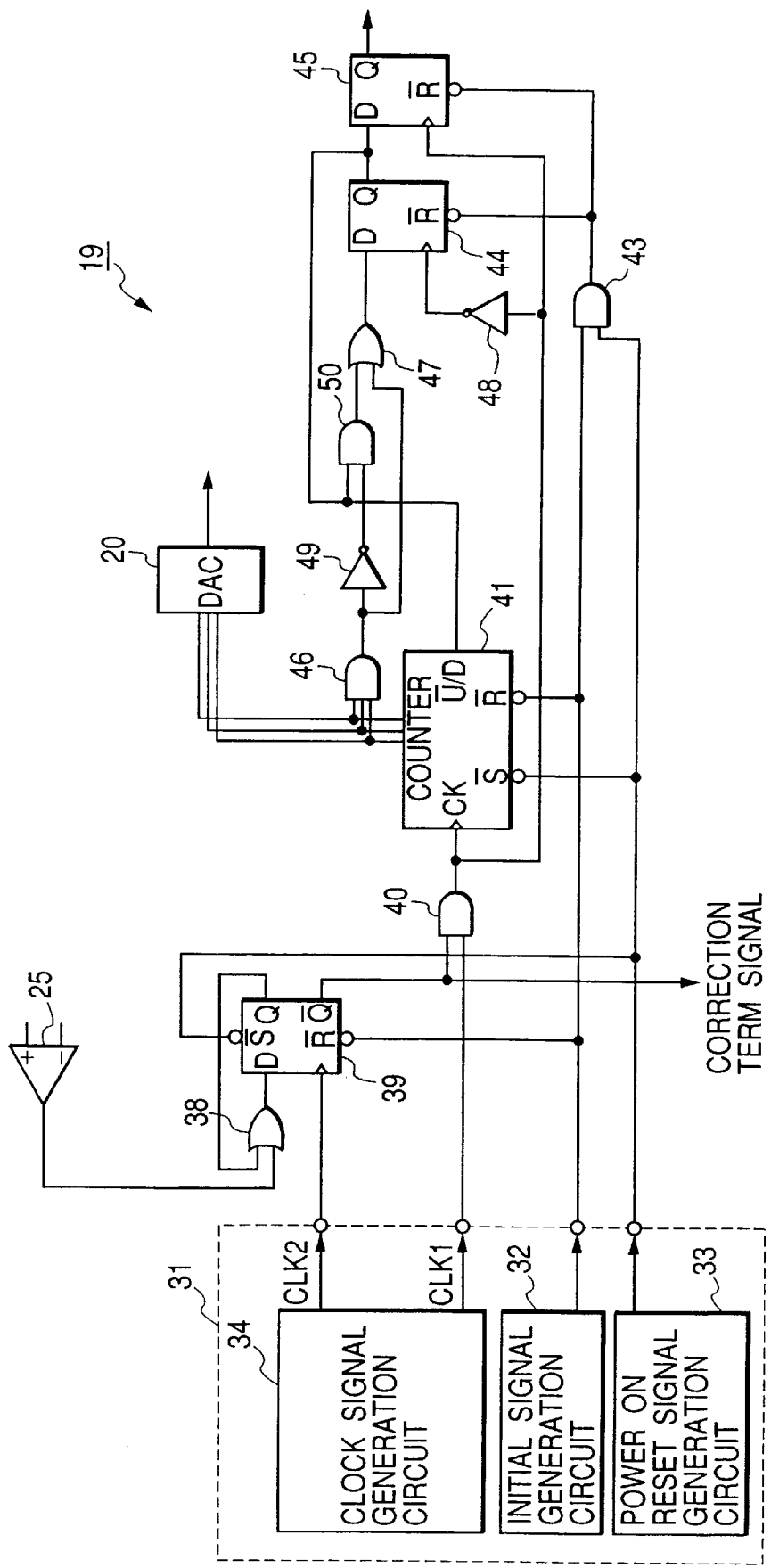
FIG. 3 is a block diagram of a control circuit in FIG. 1.

With reference to FIG. 3, the control circuit 19 includes a timing signal generation circuit 31, and a logic circuit portion following the timing signal generation circuit 31. The timing signal generation circuit 31 is connected to the microcomputer 18. The timing signal generation circuit 31 receives a correction command signal from the microcomputer 18. The timing signal generation circuit 31 outputs various timing signals to the logic circuit portion in response to the correction command signal. The logic circuit portion is connected to the digital-to-analog converter 20 and the comparator 25. The logic circuit portion receives the output signal of the comparator 25. The logic circuit portion processes the output signal of the comparator 25 into a digital corrective signal in response to the timing signals outputted from the timing signal generation circuit 31. The logic circuit portion outputs the digital corrective signal to the digital-to-analog converter 20.

The logic circuit portion of the control circuit 19 is connected to the control terminals of the switches 5, 21, 22, 23, 24, and 26. The logic circuit portion generates a control signal for the switches 5 and 26 in response to the output signal of the comparator 25 and the timing signals from the timing signal generation circuit 31. The logic circuit portion outputs the generated control signal to the control terminals of the switches 5 and 26. The control signal for the switches 5 and 26 is also referred to as the correction term signal. The logic circuit portion generates a control signal for the switches 21–24 in response to the output signal of the comparator 25 and the timing signals from the timing signal generation circuit 31. The logic circuit portion outputs the generated control signal to the control terminals of the switches 21–24.

The timing signal generation circuit 31 includes an initialization signal generation circuit 32 which produces an initialization signal in response to the correction command signal from the microcomputer 18. The initialization signal generation circuit 32 outputs the initialization signal to the logic circuit portion. Also, the timing signal generation circuit 31 includes a power-on-reset signal generation circuit 33 which produces a power-on-reset signal during a time interval when (after) all the circuits start to be supplied with electric power. The power-on-reset signal generation circuit 33 outputs the power-on-reset signal to the logic circuit portion. Furthermore, the timing signal generation circuit 31 includes a clock signal generation circuit 34 which produces clock pulse signals CLK1 and CLK2 in response to the correction command signal from the microcomputer 18. The clock signal generation circuit 34 outputs the clock pulse signals CLK1 and CLK2 to the logic circuit portion.

The logic circuit portion of the control circuit 19 includes a 2-input OR gate 38, a D-type flip-flop 39, a 2-input AND gate 40, an "n"-bit counter 41, a 2-input AND gate 43, D-type flip-flops 44 and 45, an "n"-input AND gate 46, a 2-input OR gate 47, NOT gates (inverters) 48 and 49, and a 2-input AND gate 50. Here, "n" denotes a predetermined natural number equal to, for example, 3.

A first input terminal of the OR gate 38 is connected to the output terminal of the comparator 25. A second input terminal of the OR gate 38 is connected to the non-inverting output terminal of the D-type flip-flop 39. The output terminal of the OR gate 38 is connected to the D input terminal of the D-type flip-flop 39. The reset terminal of the D-type flip-flop 39 is connected to the initialization signal generation circuit 32 to receive the initialization signal therefrom. The set terminal of the D-type flip-flop 39 is connected to the power-on-reset signal generation circuit 33 to receive the power-on-reset signal therefrom. The clock input terminal of the D-type flip-flop 39 is connected to the clock signal generation circuit 34 to receive the clock pulse signal CLK2 therefrom. The inverting output terminal of the D-type flip-flop 39 is connected to a first input terminal of the AND gate 40. Also, the inverting output terminal of the D-type flip-flop 39 is connected to the control terminals of the switches 5 and 26. A control signal for the switches 5 and 26, that is, a correction term signal, appears at the inverting output terminal of the D-type flip-flop 39. The control signal (the correction term signal) travels from the inverting output terminal of the D-type flip-flop 39 to the control terminals of the switches 5 and 26.

A second input terminal of the AND gate 40 is connected to the clock signal generation circuit 34 to receive the clock pulse signal CLK1 therefrom. The output terminal of the AND gate 40 is connected to the clock input terminal of the counter 41, the input terminal of the NOT gate 48, and the clock input terminal of the D-type flip-flop 45. The reset terminal of the counter 41 is connected to the initialization signal generation circuit 32 to receive the initialization signal therefrom. The set terminal of the counter 41 is connected to the power-on-reset signal generation circuit 33 to receive the power-on-reset signal therefrom. The "n"-bit output terminal of the counter 41 is connected to the input terminal of the digital-to-analog converter 20. The up/down control terminal of the counter 41 is connected to the non-inverting output terminal of the D-type flip-flop 44.

The bit segments of the output terminal of the counter 41 are connected to input terminals of the AND gate 46, respectively. The output terminal of the AND gate 46 is connected to the input terminal of the NOT gate 49 and a first input terminal of the OR gate 47. The output terminal of the NOT gate 49 is connected to a first input terminal of the AND gate 50. A second input terminal of the AND gate 50 is connected to the non-inverting output terminal of the D-type flip-flop 44. The output terminal of the AND gate 50 is connected to a second input terminal of the OR gate 47. The output terminal of the OR gate 47 is connected to the D input terminal of the D-type flip-flop 44. The clock input terminal of the D-type flip-flop 44 is connected to the output terminal of the NOT gate 48. The non-inverting output terminal of the D-type flip-flop 44 is connected to the D input terminal of the D-type flip-flop 45. The reset terminal of the D-type flip-flop 44 is connected to the output terminal of the AND gate 43. Also, the reset terminal of the D-type flip-flop 45 is connected to the output terminal of the AND gate 43. A first input terminal of the AND gate 43 is connected to the initialization signal generation circuit 32 to receive the initialization signal therefrom. A second input terminal of the AND gate 43 is connected to the power-on-reset signal generation circuit 33 to receive the power-on-reset signal therefrom. The non-inverting output terminal of the D-type flip-flop 45 is connected to the control terminals of the switches 21–24. A control signal for the switches 21–24 appears at the non-inverting output terminal of the D-type flip-flop 45. The control signal travels from the non-inverting output terminal of the D-type flip-flop 45 to the control terminals of the switches 21–24.

Operation of the offset voltage correction circuit will be explained hereinafter with reference to FIGS. 1, 2, 3, and 4. The decision of a desired offset corrective voltage is implemented while the correction term signal, that is, the control signal for the switches 5 and 26 is in its high-level state. The decision of the desired offset corrective voltage remains unexecuted while the correction term signal is in its low-level state.

At a preset moment t1 (see FIG. 4), the CPU 18a outputs a correction command signal to the control circuit 19. Information of the preset moment t1 is stored in the ROM 18b. The CPU 18a is informed of the preset moment t1 by the ROM 18b. The preset moment t1 is chosen so that the decision of a desired offset corrective voltage will be implemented before actual use of the operational amplifier 1.

Figure 4:
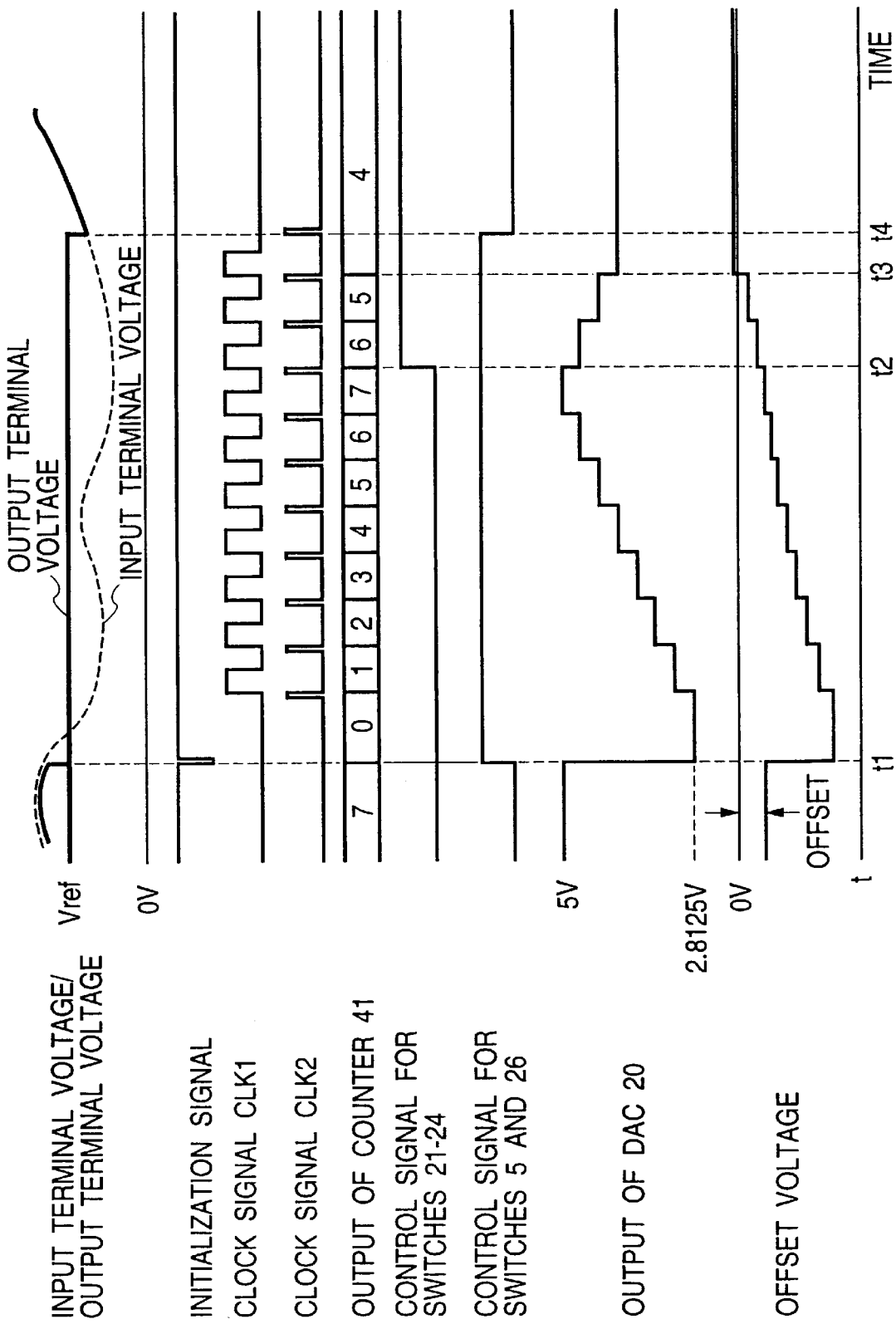
FIG. 4 is a time-domain diagram of signals in the offset voltage correction circuit in FIG. 1.

The initialization signal outputted from the initialization signal generation circuit 32 changes from a high-level state to a low-level state in response to the correction command signal. The D-type flip-flop 39 and the counter 41 are reset by the high-to-low change of the initialization signal. Thus, at the moment t1, the control signal for the switches 5 and 26 (the correction term signal) changes from the low-level state to the high-level state as shown in FIG. 4. In addition, the number of counted clock pulses which is represented by the output signal of the counter 41 is reset to "0" as shown in FIG. 4.

When the control signal for the switches 5 and 26 changes to the high-level state, the switch 5 falls into its off state (its open state) and the switch 26 changes to its on state (its closed state). Thus, the prescribed reference voltage Vref is applied from the dc power source 91 to the non-inverting input terminal 4 of the operational amplifier 1 via the switch 26. In addition, the prescribed reference voltage Vref is applied to the comparator 25. At the same time, the output signal of the operational amplifier 1 is applied to the comparator 25. The device 25 compares the prescribed reference voltage Vref and the voltage of the output signal of the operational amplifier 1. The comparator 25 continues to output a low-level signal as long as the voltage of the output signal of the operational amplifier 1 remains lower than the prescribed reference voltage Vref.

The output signal of the counter 41 has a digital form with "n" bits. The output signal of the counter 41 is applied to the digital-to-analog converter 20. When the output signal of the counter 41 represents a counted clock pulse number of "0", the digital-to-analog converter 20 outputs a predetermined lowest voltage Vlow (equal to, for example, 2.8125 V).

During a time interval before the moment t1, when the operational amplifier 1 starts to be supplied with electric power, the power-on-reset signal generation circuit 33 outputs the power-on-reset signal to the counter 41. The power-on-reset signal sets the counter 41 so that the number of counted clock pulses which is represented by the output signal of the counter 41 will change to a predetermined upper limit number. When the output signal of the counter 41 represents an upper limit number, the digital-to-analog converter 20 outputs a predetermined highest voltage equal to the positive power supply voltage VDD (for example, 5 V). In this way, before the moment t1, the digital-to-analog converter 20 outputs the predetermined highest voltage. At the moment t1, the output signal of the digital-to-analog converter 20 drops from the predetermined highest voltage to the predetermined lowest voltage Vlow.

The power-on-reset signal generation circuit 33 outputs the power-on-reset signal to the AND gate 43. The power-on-reset signal opens the AND gate 43. At the moment t1, the high-to-low change in the initialization signal travels to the D-type flip-flops 44 and 45 via the AND gate 43, and clears the D-type flip-flops 44 and 45. As a result, the D-type flip-flops 44 and 45 output low-level signals respectively. The output signal of the D-type flip-flop 44 is applied to the up/down control terminal of the counter 41. When the output signal of the D-type flip-flop 44 is in its low-level state, operation of the counter 41 is set in an up count mode. The output signal of the D-type flip-flop 45 is applied to the control terminals of the switches 21–24 as a control signal therefor. When the control signal for the switches 21–24 assumes the low-level state, the switches 21 and 24 change to their on states (their closed states) and the switches 22 and 23 change to their off states (their open states). Therefore, in this case, the output signal of the digital-to-analog converter 20 is applied to the gate of the transistor 16 while the positive power supply voltage VDD is applied to the gate of the transistor 17. As previously indicated, at the moment t1, the predetermined lowest voltage Vlow (equal to, for example, 2.8125 V) is outputted from the digital-to-analog converter 20. Thus, the voltage V1 at the gate of the transistor 17 is equal to the positive power supply voltage VDD while the voltage V2 at the gate of the transistor 16 is equal to the predetermined lowest voltage Vlow. Accordingly, in this case, the voltage V1 is higher than the voltage V2.

At the moment t1, the signal outputted from the D-type flip-flop 39 to the AND gate 40 changes to its high-level state so that the AND gate 40 is opened. Then, the clock pulse signal CLK1 travels from the clock signal generation circuit 34 to the counter 41 through the AND gate 40. Since the counter 41 is in the up count mode of operation, the counted clock pulse number represented by the output signal of the counter 41 is incremented by "1" in response to every rising edge in the clock pulse signal CLK1. Accordingly, the voltage of the output signal of the digital-to-analog converter 20 increases stepwise from the predetermined lowest voltage Vlow in accordance with the increase in the counted clock pulse number represented by the output signal of the counter 41.

Figure 5A:
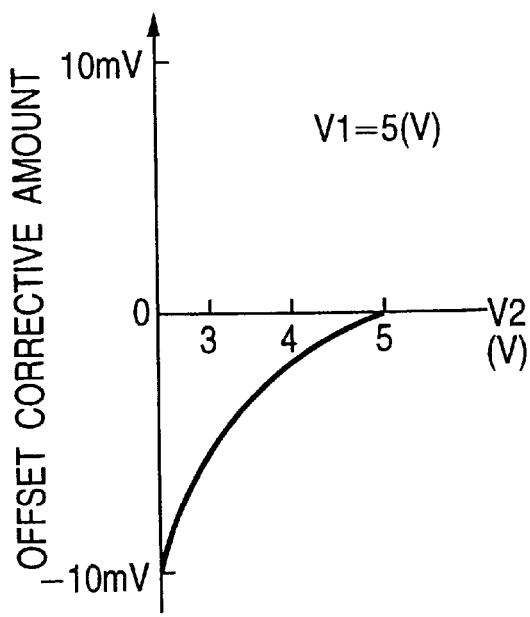
FIG. 5(a) is a diagram of the relation between a voltage V2 and an offset corrective amount in the offset voltage correction circuit in FIG. 1.
Figure 5B:
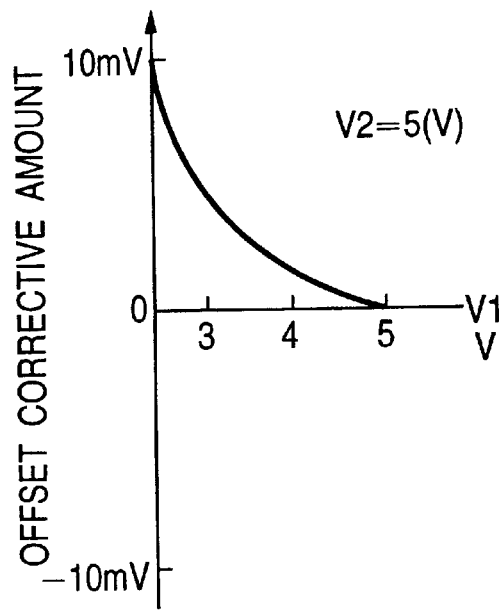
FIG. 5(b) is a diagram of the relation between a voltage V1 and the offset corrective amount in the offset voltage correction circuit in FIG. 1.

With reference to FIG. 5(a), in the case where the voltage V1 at the gate of the transistor 17 is fixed to 5 V (the positive power supply voltage VDD), an offset corrective amount or an offset corrective voltage rises from −10 mV to 0 V as the voltage V2 at the gate of the transistor 16 increases from 0 V to 5 V. With reference to FIG. 5(b), in the case where the voltage V2 at the gate of the transistor 16 is fixed to 5 V (the positive power supply voltage VDD), an offset corrective amount or an offset corrective voltage drops from 10 mV to 0 V as the voltage V1 at the gate of the transistor 17 increases from 0 V to 5 V.

After the moment t1, the counted clock pulse number represented by the output signal of the counter 41 is incremented by "1" in response to every rising edge in the clock pulse signal CLK1, and the voltage of the output signal of the digital-to-analog converter 20 increases stepwise from the predetermined lowest voltage Vlow. According to the relation indicated in FIG. 5(a), the offset corrective voltage rises as the voltage of the output signal of the digital-to-analog converter 20 increases. The voltage of the output signal of the operational amplifier 1 increases in accordance with the rise in the offset corrective voltage.

Immediately before a moment t2 which follows the moment t1, the number of counted clock pulses which is represented by the output signal of the counter 41 reaches a predetermined upper limit value, that is, "7". In this case, the digital-to-analog converter 20 outputs a highest voltage equal to the positive power supply voltage VDD. When the number of counted clock pulses reaches the predetermined upper limit value, all the bits of the output signal of the counter 41 are in high-level states so that the AND gate 46 outputs a high-level signal. The high-level signal travels from the AND gate 46 to the D-type flip-flop 44 via the OR gate 47. On the other hand, the clock pulse signal CLK1 travels from the clock signal generation circuit 34 to the NOT gate 48 and the D-type flip-flop 45 through the AND gate 40. The NOT gate 48 applies the inversion of the clock pulse signal CLK1 to the D-type flip-flop 44. The D-type flip-flop 44 outputs a high-level signal in response to the high-level signal from the OR gate 47 and a pulse in the inversion of the clock pulse signal CLK1. When the output signal of the D-type flip-flop 44 assumes its high-level state, operation of the counter 41 is changed to a down count mode. Then, the counted clock pulse number represented by the output signal of the counter 41 is decremented by "1" in response to every rising edge in the clock pulse signal CLK1. Specifically, at the moment t2, the counted clock pulse number is decremented from "7" to "6".

The high-level signal is applied from the D-type flip-flop 44 to the D-type flip-flop 45. At the moment t2, the D-type flip-flop 45 outputs a high-level control signal for the switches 21–24 in response to the high-level signal fed from the D-type flip-flop 44. When the control signal for the switches 21–24 assumes the high-level state, the switches 21 and 24 change to their off states (their open states) and the switches 22 and 23 change to their on states (their closed states). Therefore, in this case, the output signal of the digital-to-analog converter 20 is applied to the gate of the transistor 17 while the positive power supply voltage VDD is applied to the gate of the transistor 16. Thus, the voltage V1 at the gate of the transistor 17 is equal to the voltage outputted from the digital-to-analog converter 20 while the voltage V2 at the gate of the transistor 16 is equal to the positive power supply voltage VDD. At the moment t2, the change of the switches 21–24 in response to the switch control signal outputted from the D-type flip-flop 45 increases the offset corrective voltage. Then, the offset corrective voltage rises stepwise as the number of counted clock pulse number which is represented by the output signal of the counter 41 is decremented. The offset voltage of the output signal of the operational amplifier 1 increases in accordance with the rise in the offset corrective voltage as shown in FIG. 4.

During operation of the counter 41 in the down count mode, at least one of the bits of the output signal of the counter 41 is in a low-level state so that the AND gate 46 remains outputting a low-level signal. The NOT gate 49 outputs a high-level signal in response to the low-level signal outputted from the AND gate 46. The high-level signal travels from the NOT gate 49 to the D-type flip-flop 44 via the AND gate 50 so that the output signal of the D-type flip-flop 44 continues to be in its high-level state.

At a moment t3 following the moment t2, the voltage of the output signal of the operational amplifier 1 reaches the prescribed reference voltage Vref, and hence the output signal of the comparator 25 changes to a high-level state. The high-level signal travels from the comparator 25 to the D-type flip-flop 39 via the OR gate 38. Accordingly, at a moment t4 immediately after the moment t3, the control signal for the switches 5 and 26 which is outputted from the D-type flip-flop 39 returns to the low-level state. When the control signal for the switches 5 and 26 returns to the low-level state, the switch 5 falls into its on state (its closed state) and the switch 26 changes to its off state (its open state). Thus, at he moment t4, the operational amplifier 1 starts to operate as a buffer amplifier. At the same time, the D-type flip-flop 39 outputs the low-level signal to the AND gate 40, and thereby closes the AND gate 40 so that the travel of the clock pulse signal CLK1 from the clock signal generation circuit 34 to the counter 41 is inhibited. Therefore, after the moment t4, the output signal of the counter 41 remains inhibited from changing in response to the clock pulse signal CLK1. Thus, after the moment t4, the output signal of the counter 41 continues to represent the latest counted clock pulse number at which the voltage of the output signal of the operational amplifier 1 reaches the prescribed reference voltage Vref. Therefore, after the moment t4, the voltage of the output signal of the digital-to-analog converter 20 remains equal to the level at which the voltage of the output signal of the operational amplifier 1 reaches the prescribed reference voltage Vref. In other words, after the moment t4, a desired offset corrective voltage, which has been decided when the voltage of the output signal of the operational amplifier 1 reaches the prescribed reference voltage Vref, remains applied to the operational amplifier 1.

If an offset voltage in the operational amplifier 1 which occurs before the decision of a desired offset corrective voltage has a polarity opposite to that in the above-mentioned case, the voltage of the output signal of the operational amplifier 1 exceeds the prescribed reference voltage Vref and hence the output signal of the comparator 25 changes from the low-level state to the high-level state during operation of the counter 41 in the up count mode. In this case, the high-level signal travels from the comparator 25 to the D-type flip-flop 39 via the OR gate 38, and hence the D-type flip-flop 39 closes the AND gate 40. Thus, the clock pulse signal CLK1 outputted by the clock signal generation circuit 34 is inhibited from traveling to the counter 41. Therefore, the output signal of the counter 41 is inhibited from changing in response to the clock pulse signal CLK1. Then, the output signal of the counter 41 continues to represent the latest counted clock pulse number at which the voltage of the output signal of the operational amplifier 1 reaches the prescribed reference voltage Vref. Therefore, during a later state, a desired offset corrective voltage, which has been decided when the voltage of the output signal of the operational amplifier 1 reaches the prescribed reference voltage Vref, remains applied to the operational amplifier 1.

It should be noted that the input transistors 10 and 12 may be of the N-channel MOS type. In this case, it is preferable to suitably modify the ranges of variation in the voltages V1 and V2.

Second Embodiment

Figure 6:
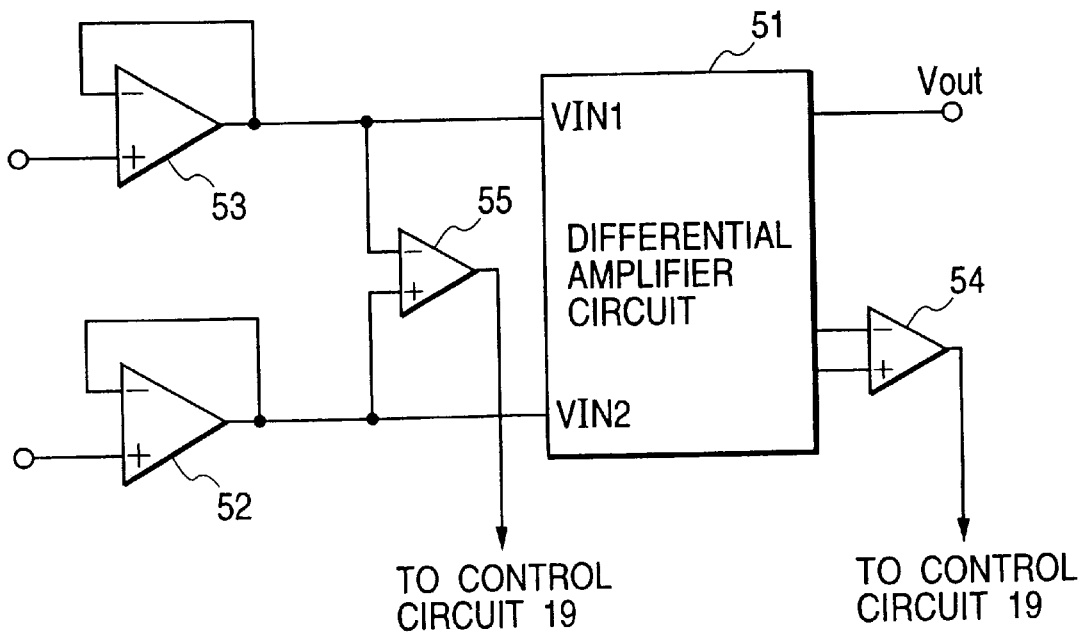
FIG. 6 is a block diagram of a portion of a circuit arrangement according to a second embodiment of this invention.

FIG. 6 shows a portion of a second embodiment of this invention which is similar to the first embodiment thereof except for design changes explained hereinafter.

The embodiment of FIG. 6 includes a differential amplifier circuit 51 and buffer circuits 52 and 53. Each of the differential amplifier circuit 51 and the buffer circuits 52 and 53 contains an operational amplifier equal in structure to the operational amplifier 1 in the first embodiment of this invention. The buffer circuits 52 and 53 are followed by the differential amplifier circuit 51.

In the embodiment of FIG. 6, a comparator 54 is connected to the differential amplifier circuit 51. The comparator 54 corresponds to the comparator 25 in the first embodiment of this invention. The comparator 54 is followed by a control circuit 19 (see FIG. 1).

In the embodiment of FIG. 6, a comparator 55 is connected to the buffer circuits 52 and 53. The comparator 55 corresponds to the comparator 25 in the first embodiment of this invention. The comparator 55 is followed by a control circuit 19 (see FIG. 1).

Figure 7:
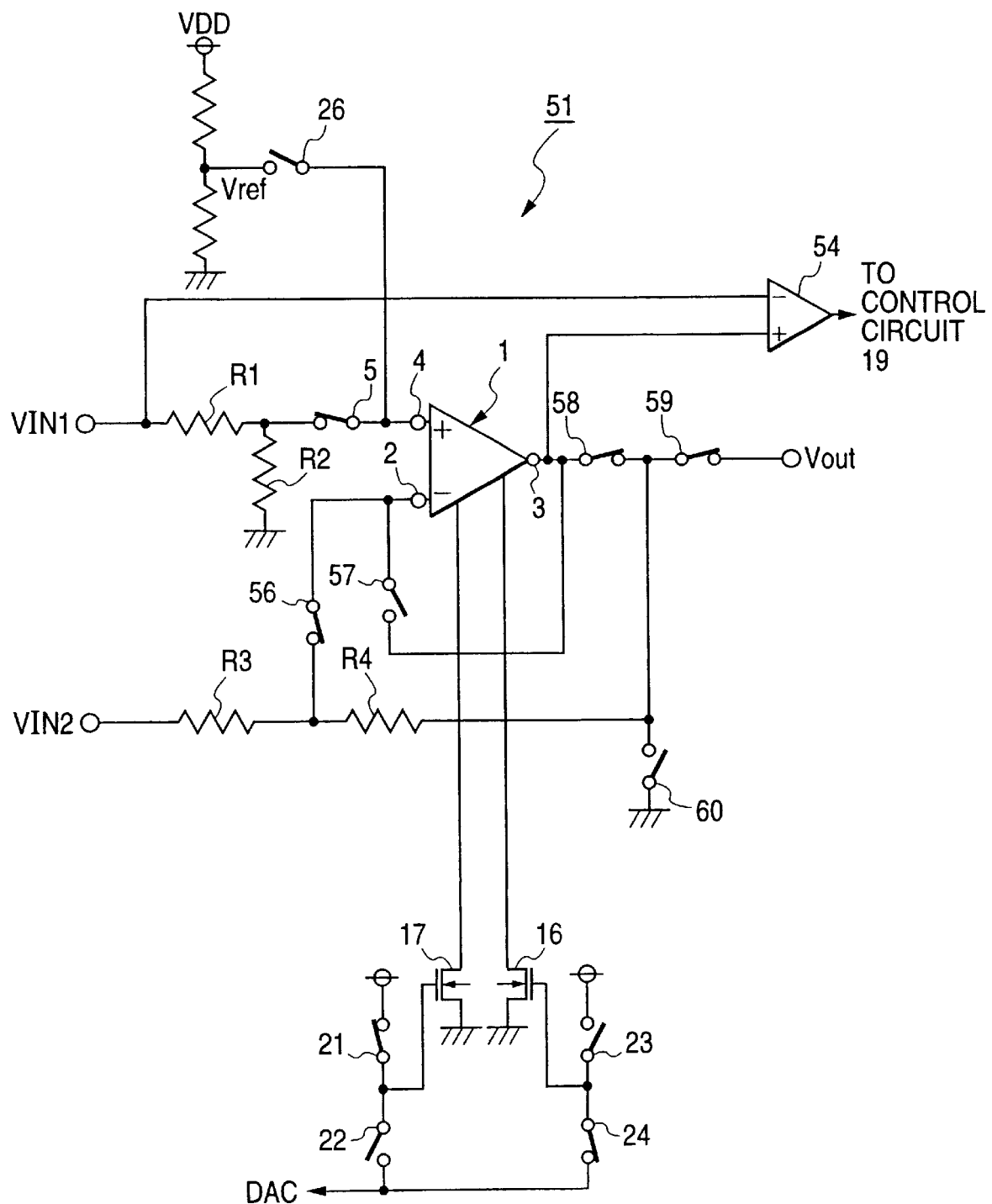
FIG. 7 is a diagram of a differential amplifier circuit in FIG. 6.

The differential amplifier circuit 51 is designed as shown in FIG. 7. The differential amplifier circuit 51 includes an operational amplifier 1. Also, the differential amplifier circuit 51 includes resistors R1, R2, R3, and R4 for setting a gain thereof. Furthermore, the differential amplifier circuit 51 includes switches 5, 26, 56, 57, 58, 59, and 60 which are changed depending on whether operation of the differential amplifier circuit 51 is in a normal mode or an offset corrective voltage decision mode.

The resistance of the resistor R1 is equal to that of the resistor R3. The resistance of the resistor R2 is equal to that of the resistor R4. The gain of the differential amplifier circuit 51 is determined by the ratio in resistance between the resistors R1 and R2. During the normal mode of operation of the differential amplifier circuit 51, the switches 5, 56, 58, and 59 are in their on states while the switches 26, 57, and 60 are in their off states. During the offset corrective voltage decision mode of operation of the differential amplifier circuit 51, the switches 5, 56, 58, and 59 are in their off states while the switches 26, 57, and 60 are in their on states.

An offset voltage in the buffer circuit 52 is corrected so that the difference between the voltage of the output signal of the buffer circuit 52 and the voltage of the output signal of the buffer circuit 53 will be nullified when an input voltage applied to the buffer circuit 52 and an input voltage applied to the buffer circuit 53 are equal.

It should be noted that the circuits in FIG. 7 may be designed as sample-and-hold circuits. In this case, a series combination of a capacitor and a resistor is connected between an output terminal Vout and the ground, and the switch 59 is controlled in response to a correction term signal. While the decision of a desired offset corrective voltage remains unexecuted, the switch 59 is in its on state and a sampling process is implemented. At the start of the decision of the desired offset corrective voltage, the switch 59 is changed to its off state to hold the output terminal voltage which occurs immediately before the start of the decision of the desired offset corrective voltage. During the execution of the decision of the desired offset corrective voltage, the sample and hold function prevents a significant deviation of the output terminal voltage from that occurring when the decision of the desired offset corrective voltage is unexecuted. In the case where the time interval of the execution of the decision of the desired offset corrective voltage is made sufficiently short with respect to an input signal which slowly varies in time domain, the operational amplifier 1 can be continuously used without interrupting its operation for the decision of the desired offset corrective voltage.

Third Embodiment

Figure 8:
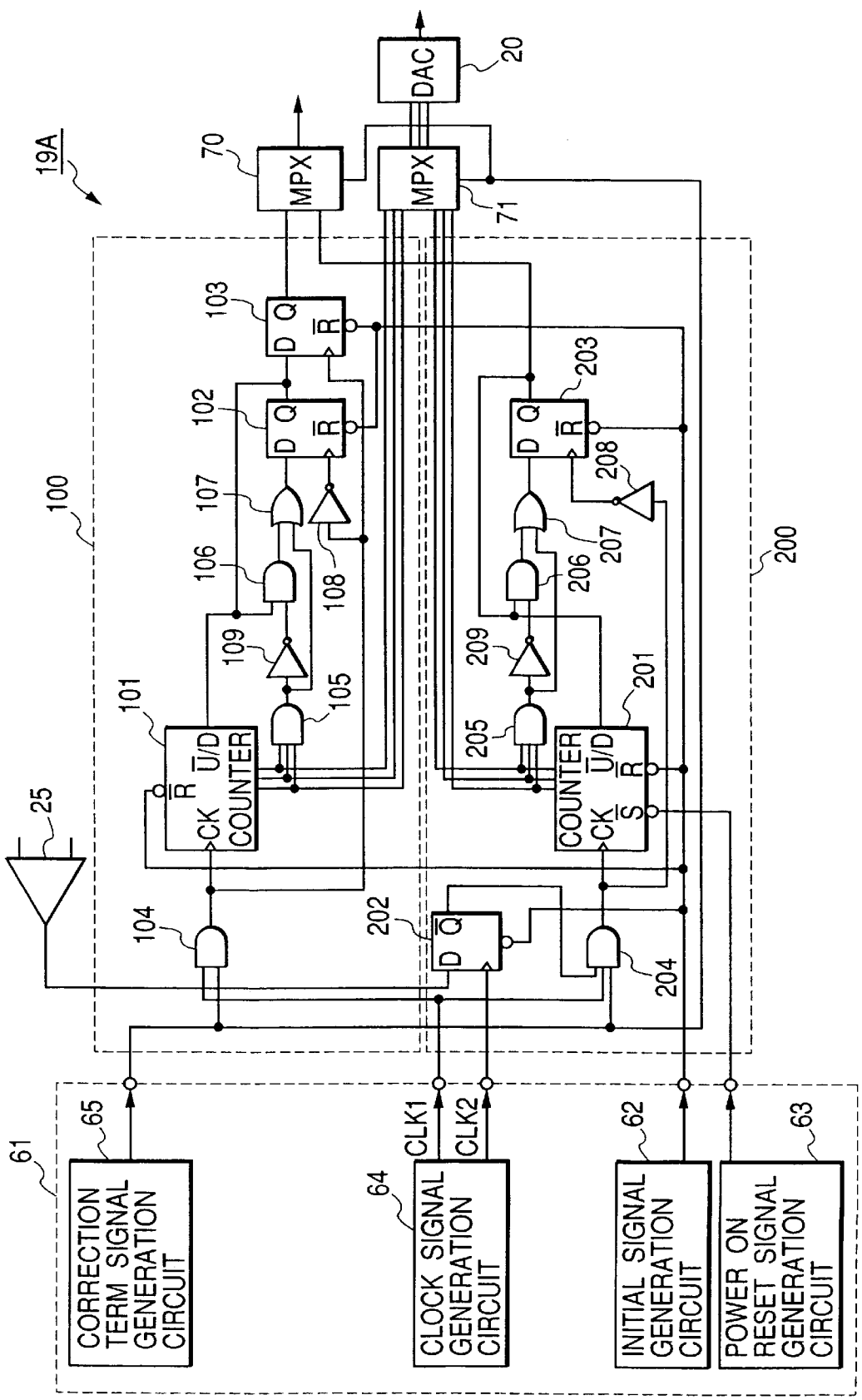
FIG. 8 is a block diagram of a control circuit according to a third embodiment of this invention.

A third embodiment of this invention is similar to the first embodiment thereof except that a control circuit 19A replaces the control circuit 19 in FIGS. 1 and 3. As shown in FIG. 8, the control circuit 19A includes a timing signal generation circuit 61 having a correction term signal generation circuit 65.

As shown in FIG. 8, the control circuit 19A also includes a first circuit 100 and a second circuit 200. The first circuit 100 has a counter 101 which implements one cycle of an up counting process and a down counting process regardless of the output signal of a comparator 25. The second circuit 200 has a counter 201 which can be stopped in response to the output signal of the comparator 25. During the execution of the decision of a desired offset corrective voltage, the voltage generated by a digital-to-analog converter 20 is controlled by the first circuit 100. During the execution of the decision of the desired offset corrective voltage, the second circuit 200 detects the output voltage of the digital-to-analog converter 20 which is suited for offset voltage correction.

The first circuit 100 and the second circuit 200 include D-type flip-flops 103 and 203 for generating control signals for switches 21–24. In the first circuit 100 and the second circuit 200, the counters 101 and 201 generate and output signals to be inputted into the digital-to-analog converter 20. A multiplexer 70 following the D-type flip-flops 103 and 203 selects one of the control signals for the switches 21–24, and transmits the selected control signal to the control terminals of the switches 21–24. A multiplexer 71 selects one of the output signals of the counters 101 and 201, and transmits the selected signal to the digital-to-analog converter 20. During the execution of the decision of the desired offset corrective voltage, the multiplexer 70 selects the switch control signal generated by the D-type flip-flop 103 within the first circuit 100 while the multiplexer 71 selects the output signal of the counter 101 within the first circuit 100. During the execution of the decision of the offset corrective voltage, the second circuit 200 decides or detects a desired signal inputted into the digital-to-analog converter 20 and a desired control signal for the switches 21–24 which are suited for the offset voltage correction. When the decision of the desired offset corrective voltage is completed, the multiplexer 70 selects the switch control signal generated by the D-type flip-flop 203 within the second circuit 200 while the multiplexer 71 selects the output signal of the counter 201 within the second circuit 200 to implement the offset voltage correction.

Figure 9:
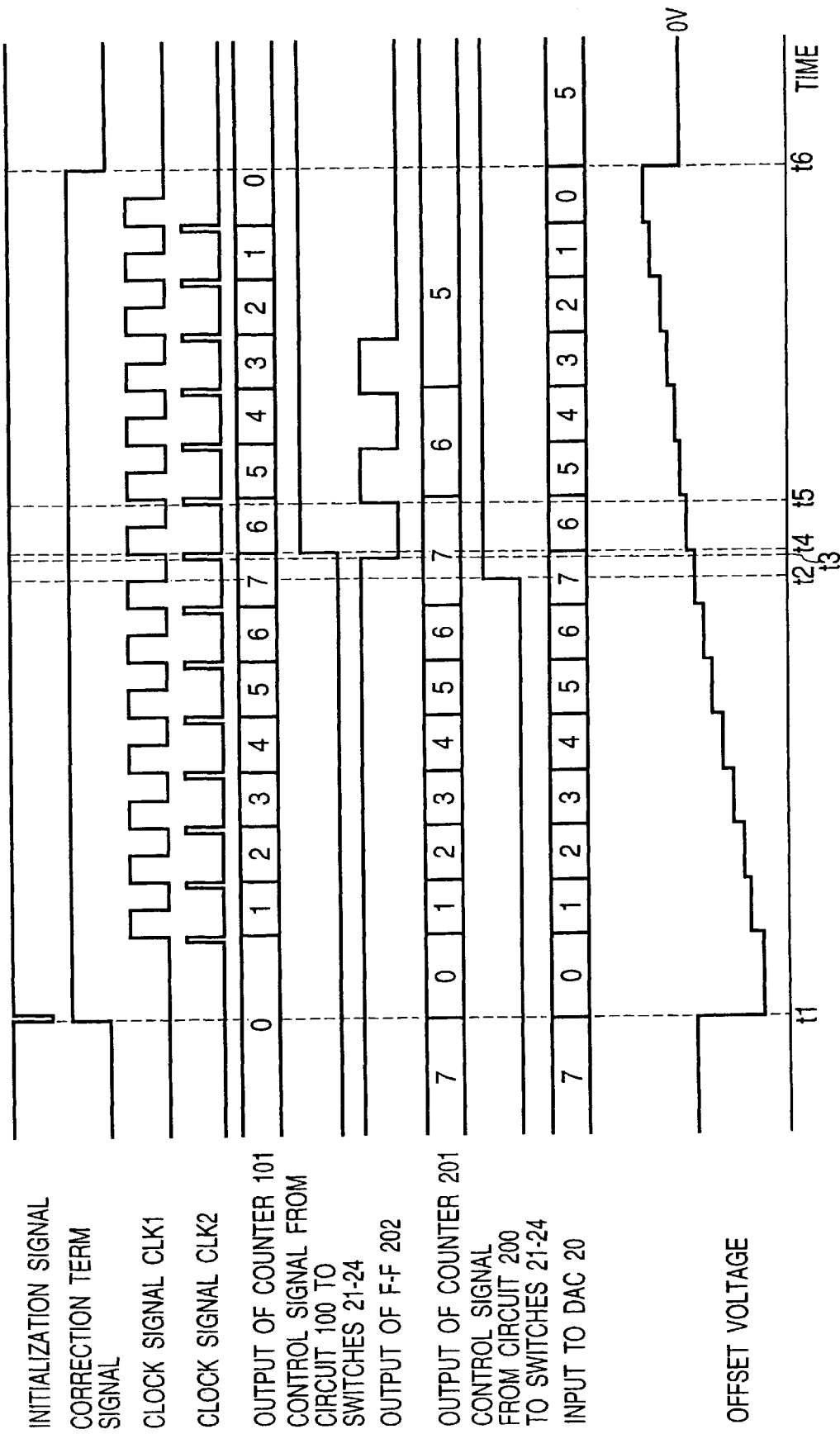
FIG. 9 is a time-domain diagram of signals in the control circuit in FIG. 8.

Operation of the offset voltage correction circuit will be explained hereinafter with reference to FIGS. 8 and 9. The decision of a desired offset corrective voltage is implemented while a correction term signal, that is, the output signal of the correction term signal generation circuit 65, is in its high-level state. The decision of the desired offset corrective voltage remains unexecuted while the correction term signal is in its low-level state.

At a preset moment t1, a CPU 18a (see FIG. 1) outputs a correction command signal to the control circuit 19A. The correction term signal is changed from a low-level state to a high-level state in response to the correction command signal. The correction term signal is fed to the multiplexers 70 and 71. When the correction term signal is changed to the high-level state, the multiplexer 70 selects the switch control signal generated by the D-type flip-flop 103 within the first circuit 100 and the multiplexer 71 selects the output signal of the counter 101 within the first circuit 100.

The correction term signal is applied to the control terminals of switches 5 and 26 (see FIG. 1). When the correction term signal is in its high-level state, the switch 5 is in its off state and the switch 26 is in its on state. Thus, in this case, a prescribed reference voltage Vref is applied to the non-inverting input terminal 4 of the operational amplifier 1 (see FIG. 1).

At the moment t1, an initialization signal generated by an initialization signal generation circuit 62 changes from a high-level state to a low-level state in response to the correction command signal. D-type flip-flops 102 and 103 and the counter 101 within the first circuit 100 are cleared by the high-to-low change of the initialization signal. Thus, at the moment t1, the D-type flip-flops 102 and 103 start to output low-level signals. In addition, the number of counted clock pulses which is represented by the output signal of the counter 101 is reset to "0". The low-level signal (the control signal for the switches 21-24) travels from the D-type flip-flop 103 to the multiplexer 70. The output signal of the counter 101 which represents a counted clock pulse number of "0" travels to the multiplexer 71.

D-type flip-flops 202 and 203 and the counter 201 within the second circuit 200 are cleared by the high-to-low change of the initialization signal. Thus, at the moment t1, the D-type flip-flop 202 outputs a high-level signal while the D-type flip-flop 203 outputs a low-level signal. In addition, the number of counted clock pulses which is represented by the output signal of the counter 201 is reset to "0". The low-level signal (the control signal for the switches 21–24) travels from the D-type flip-flop 203 to the multiplexer 70. The output signal of the counter 201 which represents a counted clock pulse number of "0" travels to the multiplexer 71.

At the moment t1, the multiplexer 70 selects the output signal of the D-type flip-flop 103 within the first circuit 100, and hence outputs a low-level signal as a control signal for the switches 21–24. The multiplexer 71 selects the output signal of the counter 101 within the first circuit 100, and applies the output signal of the counter 101 to the digital-to-analog converter 20. Since the output signal of the counter 101 represents a counted clock pulse number of "0", the digital-to-analog converter 20 outputs a predetermined lowest voltage Vlow (equal to, for example, 2.8125 V). When the control signal for the switches 21–24 assumes the low-level state, the switches 21 and 24 change to their on states (their closed states) and the switches 22 and 23 change to their off states (their open states). Therefore, in this case, the output signal of the digital-to-analog converter 20 is applied to the gate of a transistor 16 (see FIG. 1) while a positive power supply voltage VDD is applied to the gate of a transistor 17 (see FIG. 1). As previously indicated, at the moment t1, the predetermined lowest voltage Vlow (equal to, for example, 2.8125 V) is outputted from the digital-to-analog converter 20. Thus, the voltage V1 at the gate of the transistor 17 is equal to the positive power supply voltage VDD while the voltage V2 at the gate of the transistor 16 is equal to the predetermined lowest voltage Vlow. Accordingly, in this case, the voltage V1 is higher than the voltage V2.

During the time interval between the moment t1 and a subsequent moment t2, the high-level correction term signal opens an AND gate 104. When the AND gate 104 is open, a clock pulse signal CLK1 travels from a clock generation circuit 64 to the counter 101 within the first circuit 100. Since operation of the counter 101 is in an up count mode, the counted clock pulse number represented by the output signal of the counter 101 is incremented by "1" in response to every rising edge in the clock pulse signal CLK1.

During the time interval between the moments t1 and t2, the output signal of the comparator 25 is in its low-level state so that the D-type flip-flop 202 outputs a high-level signal. The high-level output signal of the D-type flip-flop 202 and the high-level correction term signal open an AND gate 204. When the AND gate 204 is open, the clock pulse signal CLK1 travels from the clock generation circuit 64 to the counter 201 within the second circuit 200. Since operation of the counter 201 is in an up count mode, the counted clock pulse number represented by the output signal of the counter 201 is incremented by "1" in response to every rising edge in the clock pulse signal CLK1.

During the time interval between the moments t1 and t2, the multiplexer 71 selects the output signal of the counter 101 within the first circuit 100, and applies the output signal of the counter 101 to the digital-to-analog converter 20. The counted clock pulse number represented by the output signal of the counter 101 is incremented by "1" in response to every rising edge in the clock pulse signal CLK1, and hence the voltage of the output signal of the digital-to-analog converter 20 increases stepwise from the predetermined lowest voltage Vlow.

Until the moment t2, at least one of bits of the output signal of the counter 101 is in a low-level state, and an AND gate 105 continues to output a low-level signal. Since the output signal of the D-type flip-flop 102 is in its low-level state, the output signal of an AND gate 106 is in its low-level state. Thus, an OR gate 107 continues to output a low-level signal, and the D-type flip-flops 102 and 103 remains outputting the low-level signals. Accordingly, until the moment t2, the control signal fed to the switches 21–24 via the multiplexer 70 is in its low-level state so that the switches 21 and 24 remain in their on states while the switches 22 and 23 remain in their off states.

Immediately before the moment t2, the number of counted clock pulses which is represented by the output signal of the counter 101 reaches a predetermined upper limit value, that is, "7". In this case, the digital-to-analog converter 20 outputs a highest voltage equal to the positive power supply voltage VDD. When the number of counted clock pulses reaches the predetermined upper limit value, all the bits of the output signal of the counter 101 are in high-level states so that the AND gate 105 outputs a high-level signal. The high-level signal travels from the AND gate 105 to the D-type flip-flop 102 via the OR gate 107. On the other hand, the clock pulse signal CLK1 travels from the clock signal generation circuit 64 to a NOT gate 108 and the D-type flip-flop 103 through the AND gate 104. The NOT gate 108 applies the inversion of the clock pulse signal CLK1 to the D-type flip-flop 102. The D-type flip-flop 102 outputs a high-level signal in response to the high-level signal from the OR gate 107 and a pulse in the inversion of the clock pulse signal CLK1. When the output signal of the D-type flip-flop 102 assumes its high-level state, operation of the counter 101 is changed to a down count mode. Then, the counted clock pulse number represented by the output signal of the counter 101 is decremented by "1" in response to every rising edge in the clock pulse signal CLK1. Specifically, at a moment t4 following the moment t2, the counted clock pulse number is decremented from "7" to "6".

Immediately before the moment t2, the number of counted clock pulses which is represented by the output signal of the counter 201 reaches a predetermined upper limit value, that is, "7". When the number of counted clock pulses reaches the predetermined upper limit value, all the bits of the output signal of the counter 201 are in high-level states so that an AND gate 205 outputs a high-level signal. The high-level signal travels from the AND gate 205 to the D-type flip-flop 203 via an OR gate 207. On the other hand, the clock pulse signal CLK1 travels from the clock signal generation circuit 64 to a NOT gate 208 through the AND gate 204. The NOT gate 208 applies the inversion of the clock pulse signal CLK1 to the D-type flip-flop 203. The D-type flip-flop 203 outputs a high-level signal in response to the high-level signal from the OR gate 207 and a pulse in the inversion of the clock pulse signal CLK1. When the output signal of the D-type flip-flop 203 assumes its high-level state, operation of the counter 201 is changed to a down count mode. Then, the counted clock pulse number represented by the output signal of the counter 201 is decremented by "1" in response to every rising edge in the clock pulse signal CLK1. Specifically, immediately after a moment t5 following the moment t4, the counted clock pulse number is decremented from "7" to "6".

At a moment t3 between the moments t2 and t4, the output signal of the D-type flip-flop 202 changes from its high-level state to its low-level state in response to a low-to-high change of the output signal of the comparator 25. It should be noted that the output signal of the comparator 25 changes from its low-level state to its high-level state when the voltage of the output signal of the operational amplifier 1 (see FIG. 1) reaches the prescribed reference voltage Vref. The low-level output signal of the D-type flip-flop 202 closes the AND gate 204 so that the clock pulse signal CLK1 outputted by the clock signal generation circuit 64 is inhibited from traveling to the counter 201. Therefore, after the moment t3, the output signal of the counter 201 remains inhibited from changing in response to the clock pulse signal CLK1. Thus, after the moment t3, the output signal of the counter 201 continues to represent the latest counted clock pulse number at which the voltage of the output signal of the operational amplifier 1 reaches the prescribed reference voltage Vref.

At the moment t4, the D-type flip-flop 102 outputs the high-level signal to the D-type flip-flop 103, and there occurs a rising edge in the clock pulse signal CLK1. The D-type flip-flop 103 samples and holds the high-level output signal of the D-type flip-flop 102 in response to the rising edge in the clock pulse signal CLK1. Therefore, at the moment t4, the D-type flip-flop 103 outputs a high-level control signal for the switches 21–24. The high-level control signal travels from the D-type flip-flop 103 to the control terminals of the switches 21–24 through the multiplexer 70. When the control signal for the switches 21–24 assumes the high-level state, the switches 21 and 24 change to their off states (their open states) and the switches 22 and 23 change to their on states (their closed states). Therefore, in this case, the output signal of the digital-to-analog converter 20 is applied to the gate of the transistor 17 (see FIG. 1) while the positive power supply voltage VDD is applied to the gate of the transistor 16 (see FIG. 1). Thus, the voltage V1 at the gate of the transistor 17 is equal to the voltage outputted from the digital-to-analog converter 20 while the voltage V2 at the gate of the transistor 16 is equal to the positive power supply voltage VDD. At the moment t4, the change of the switches 21–24 in response to the switch control signal outputted from the D-type flip-flop 103 increases the offset corrective voltage as shown in FIG. 9. Then, the offset corrective voltage rises stepwise as the number of counted clock pulse number which is represented by the output signal of the counter 101 is decremented. The voltage of the output signal of the operational amplifier 1 increases in accordance with the rise in the offset corrective voltage. As previously indicated, at the moment t4, the counted clock pulse number represented by the output signal of the counter 101 is decremented from "7" to "6".

At the moment t4, the output signal of the D-type flip-flop 202 is in its low-level state so that the AND gate 204 remains closed. Thus, the output signal of the counter 201 continues to represent the latest counted clock pulse number at which the voltage of the output signal of the operational amplifier 1 reaches the prescribed reference voltage Vref.

A NOT gate 109 connected between the AND gates 105 and 106 prevents the output signal of the D-type flip-flop 102 from responding to a change in the output signal of the AND gate 105 after operation of the counter 101 changes from the up count mode to the down count mode. A NOT gate 209 connected between the AND gates 205 and 206 prevents the output signal of the D-type flip-flop 203 from responding to a change in the output signal of the AND gate 205 after operation of the counter 201 changes from the up count mode to the down count mode.

At the moment t5, the output signal of the D-type flip-flop 202 changes from its low-level state to its high-level state in response to a return of the output signal of the comparator 25 to its low-level state. The high-level output signal of the D-type flip-flop 202 opens the AND gate 204 so that the clock pulse signal CLK1 travels from the clock signal generation circuit 64 to the counter 201. Thus, the counter 201 restarts counting in response to the clock pulse signal CLK1. Immediately after the moment t5, the counted clock pulse number represented by the output signal of the counter 201 is decremented from "7" to "6". In this way, the counter 201 implements counting in response to the clock pulse signal CLK1 only when the output signal of the D-type flip-flop 202 is in its high-level state. This operation of the counter 201 removes a noise-based problem, and hence enables the counted clock pulse number represented by the output signal of the counter 201 to finally fall into accurate correspondence with a desired offset corrective voltage. It should be noted that the logic state of the output signal of the D-type flip-flop 202 is determined by the logic state of the output signal of the comparator 25.

Immediately before a moment t6 which follows the moment t5, the counted clock pulse number represented by the output signal of the counter 101 is decremented to "0". At the moment t6, the correction term signal changes from its high-level state to its low-level state. The low-level correction term signal closes the AND gate 104 so that the clock pulse signal CLK1 is inhibited from traveling to the counter 101. As a result, the counter 101 suspends counting. The correction term signal generation circuit 65 is designed to set the following time interval. The time interval during which the correction term signal remains in its high-level state is set into agreement with the time interval for which the counted clock pulse number represented by the output signal of the counter 101 rises from "0" to "7" and then returns from "7" to "0".

At the moment t6, the output signal of the D-type flip-flop 202 is in its low-level state so that the counter 201 suspends counting. Thus, the counted clock pulse number represented by the output signal of the counter 201 is held at the latest number, that is, "5". The low-level output signal of the D-type flip-flop 202 closes the AND gate 204 so that the AND gate 204 outputs a low-level signal. The low-level output signal of the AND gate 204 holds the output signal of the D-type flip-flop 203 in its high-level state.

When the correction term signal changes from its high-level state to its low-level state, the multiplexer 70 selects the output signal of the D-type flip-flop 203 within the circuit 200 as a control signal for the switches 21–24. At the same time, the multiplexer 71 selects the output signal of the counter 201, and transmits the output signal of the counter 201 to the digital-to-analog converter 20. The digital-to-analog converter 20 generates a voltage depending on the counted clock pulse number represented by the output signal of the counter 201. The generated voltage is transmitted from the digital-to-analog converter 20 to the gate of the transistor 16 or 17 (see FIG. 1). Since the counted clock pulse number represented by the output signal of the counter 201 corresponds to the desired offset corrective voltage, an offset voltage in the operational amplifier 1 (see FIG. 1) is reliably corrected while the occurrence of a noise-based problem is prevented.

Fourth Embodiment

Figure 10:
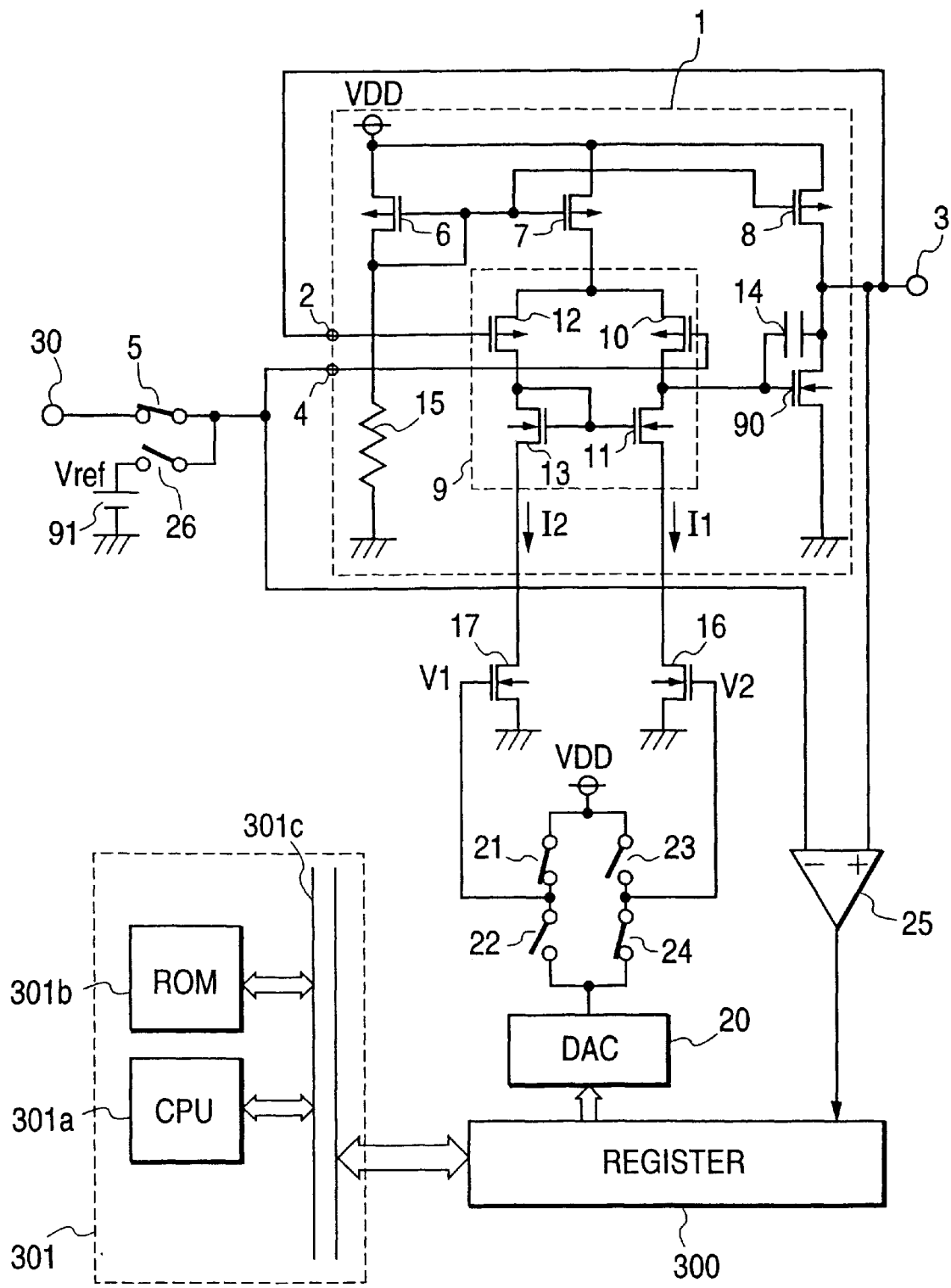
FIG. 10 is a diagram of an offset voltage correction circuit and an operational amplifier according to a fourth embodiment of this invention.

FIG. 10 shows a fourth embodiment of this invention which is similar to the first embodiment thereof except for design changes explained hereinafter. The embodiment of FIG. 10 includes a resistor 300 which replaces the control circuit 19 (see FIG. 1). Also, the embodiment of FIG. 10 includes a microcomputer 301 which replaces the microcomputer 18 (see FIG. 1).

The register 300 has first, second, third, and fourth sections. The first section of the register 300 is assigned to a signal outputted to a digital-to-analog converter 20. The second section of the register 300 is assigned to the output signal of a comparator 25. The third section of the register 300 is assigned to a control signal for switches 5 and 26. The fourth section of the register 300 is assigned to a control signal for switches 21–24.

The microcomputer 301 includes a CPU 301a, a ROM 301b, and a bus 301c. The CPU 301a and the ROM 301b are connected via the bus 301c. The register 300 is connected to the bus 301c within the microcomputer 301. The combination of the microcomputer 301 and the register 300 operates in accordance with a program stored in the ROM 301b.

Figure 11:
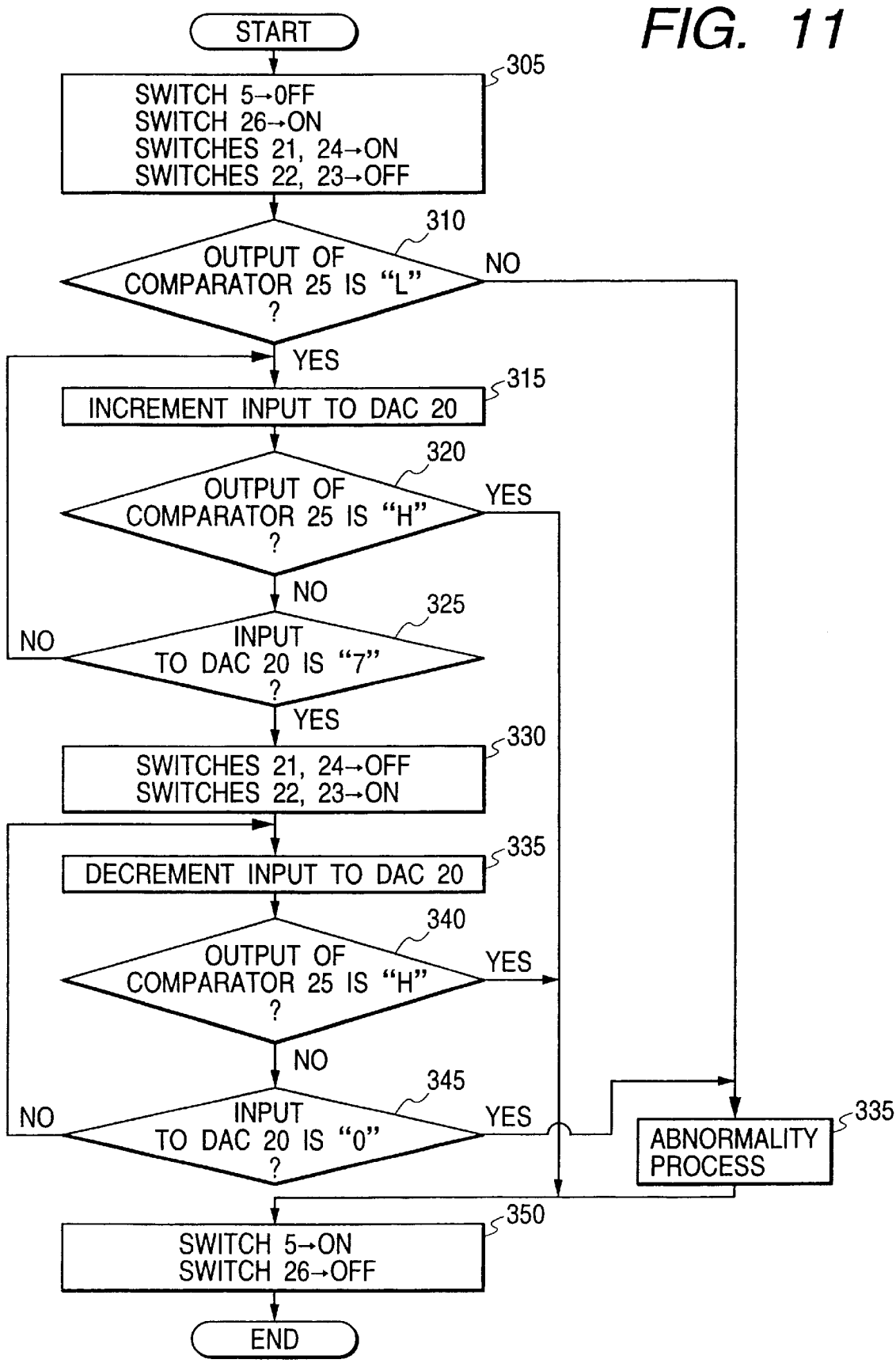
FIG. 11 is a flowchart of a segment of a program for the combination of a microcomputer and a register in FIG. 10.

FIG. 11 shows a segment of the program for the combination of the microcomputer 301 and the register 300. As shown in FIG. 11, a first step 305 of the program segment sets switches 5, 22, and 23 in their off states. The step 305 sets switches 21, 24, and 26 in their on states. When a given short time has elapsed thereafter, the program advances from the step 305 to a step 310.

The step 310 decides whether or not the output signal of the comparator 25 is in its low-level state. When it is decided that the output signal of the comparator 25 is in its low-level state, the program advances from the step 310 to a step 315. Otherwise, the program advances from the step 310 to a step 355.

The step 315 increments the value represented by the signal outputted to the digital-to-analog converter 20. Accordingly, the voltage outputted from the digital-to-analog converter 20 rises by a given level. When a given short time has elapsed thereafter, the program advances from the step 315 to a step 320.

The step 320 decides whether or not the output signal of the comparator 25 is in its high-level state. When it is decided that the output signal of the comparator 25 is in its high-level state, the program advances from the step 320 to a step 350. Otherwise, the program advances from the step 320 to a step 325.

The step 325 decides whether or not the value represented by the signal outputted to the digital-to-analog converter 20 is equal to "7" in decimal notation. When it is decided that the value in question is equal to "7", the program advances from the step 325 to a step 330. Otherwise, the program returns from the step 325 to the step 315.

The step 330 changes the switches 21 and 24 to their off states. The step 330 changes the switches 22 and 23 to their on states.

A step 335 following the step 330 decrements the value represented by the signal outputted to the digital-to-analog converter 20. Accordingly, the voltage outputted from the digital-to-analog converter 20 drops by the given level. When a given short time has elapsed thereafter, the program advances from the step 335 to a step 340.

The step 340 decides whether or not the output signal of the comparator 25 is in its high-level state. When it is decided that the output signal of the comparator 25 is in its high-level state, the program advances from the step 340 to the step 350. Otherwise, the program advances from the step 340 to a step 345.

The step 345 decides whether or not the value represented by the signal outputted to the digital-to-analog converter 20 is equal to "0" in decimal notation. When it is decided that the value in question is equal to "0", the program advances from the step 345 to the step 355. Otherwise, the program returns from the step 345 to the step 335.

The step 355 sets an abnormality indication flag to "1". After the step 355, the program advances to the step 350.

The step 350 changes the switch 5 to its on state. The step 350 changes the switch 26 to its off state. After the step 350, the current execution cycle of the program segment ends.

Fifth Embodiment

Figure 12:
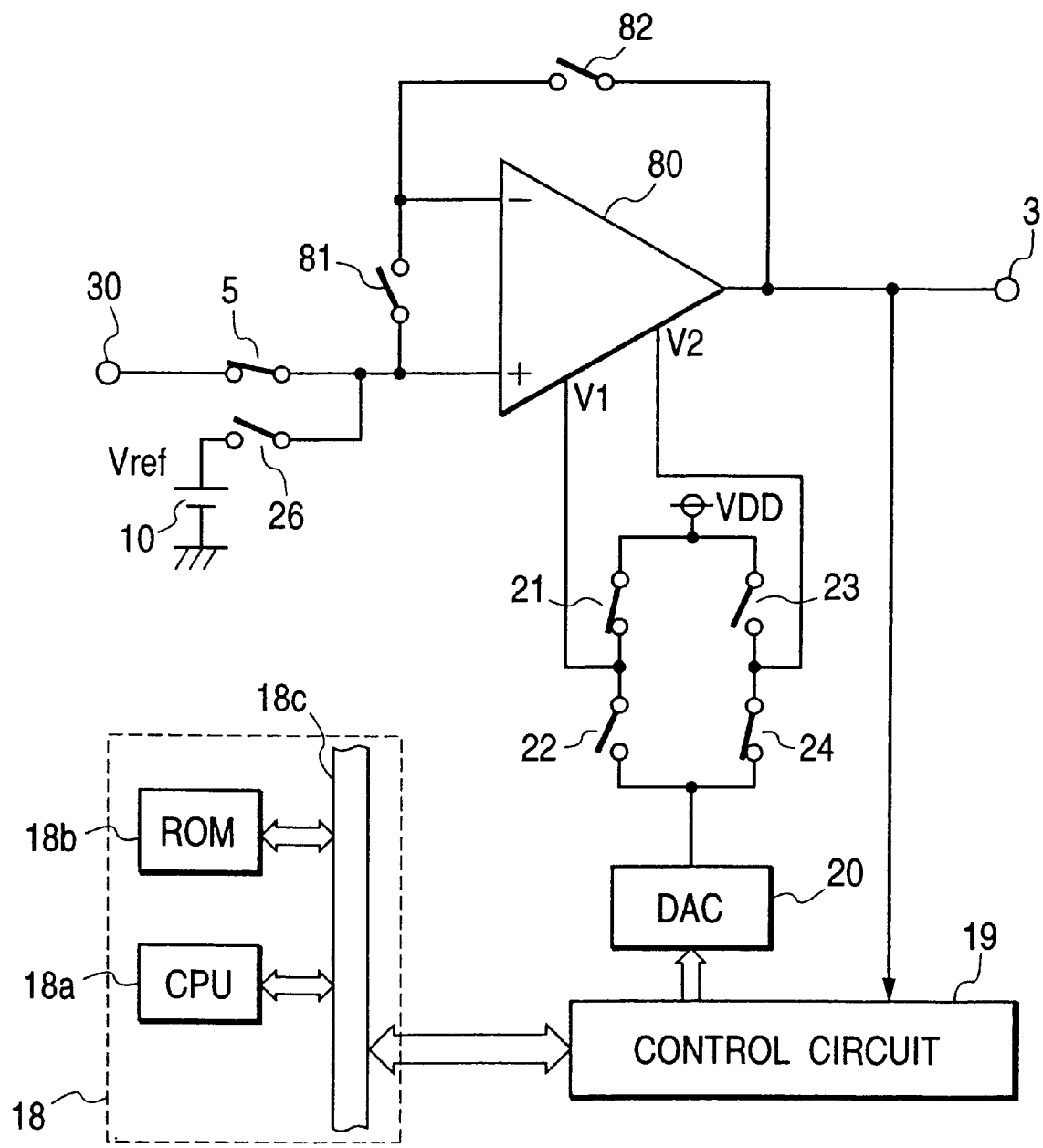
FIG. 12 is a diagram of an offset voltage correction circuit and an operational amplifier according to a fifth embodiment of this invention.

FIG. 12 shows a fifth embodiment of this invention which is similar to the first embodiment thereof except for design changes explained hereinafter. The embodiment of FIG. 12 includes an operational amplifier 80 used as a comparator. The operational amplifier 80 is modified from the operational amplifier 1 (see FIG. 1) as explained later.

As shown in FIG. 12, the inverting input terminal and the non-inverting input terminal of the operational amplifier 80 are connected via a switch 81. The inverting input terminal and the output terminal of the operational amplifier 80 are connected via a switch 82.

Figure 13:
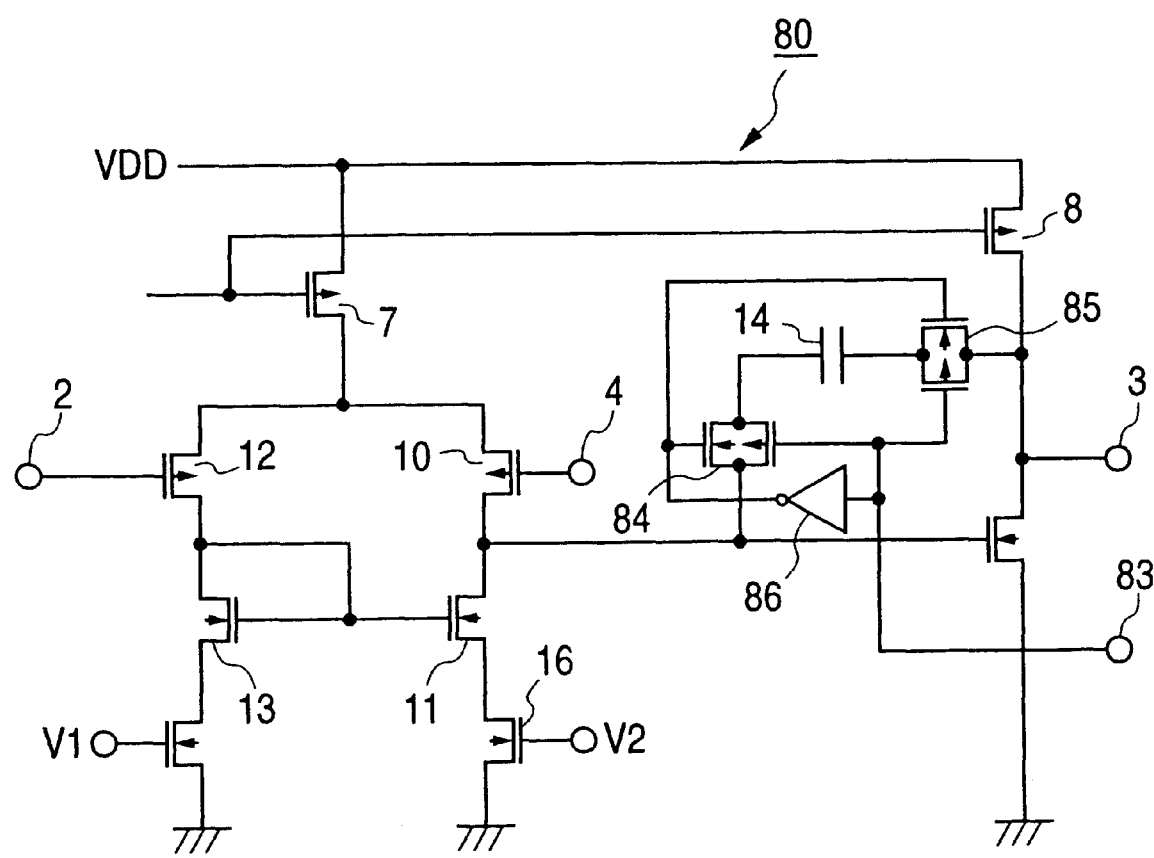
FIG. 13 is a diagram of the operational amplifier in FIG. 12.

As shown in FIG. 13, a first end of a phase compensation capacitor 14 within the operational amplifier 80 is connected to an analog switch 84 composed of a P-channel MOS transistor and an N-channel MOS transistor. A second end of the phase compensation capacitor 14 is connected to an analog switch 85 composed of a P-channel MOS transistor and an N-channel MOS transistor. Each of the analog switches 84 and 85 is changed between its on state and its off state by a control signal inputted via a terminal 83. An inverter 86 connected between the terminal 83 and the analog switches 84 and 85 inverts the control signal inputted via the terminal 83.

Operation of the operational amplifier 80 can be changed between a normal mode and an offset corrective voltage decision mode. During the normal mode of operation of the operational amplifier 80, the analog switches 84 and 85 are set in their on states. During the offset corrective voltage decision mode of operation of the operational amplifier 80, the analog switches 84 and 85 are set in their off states. In this case, the operational amplifier 80 serves as a comparator.

The decision of a desired offset corrective voltage is implemented in response to the output signal of the operational amplifier 80. Therefore, it is possible to omit the comparator 25 (see FIG. 1).

As previously indicated, the analog switches 84 and 85 are connected to the ends of the phase compensation capacitor 14, respectively. While the analog switches 84 and 85 are in their off states, the voltage across the phase compensation capacitor 14 continues to be held. Therefore, in the case where operation of the operational amplifier 80 is changed from the offset corrective voltage decision mode to the normal mode, voltages in the operational amplifier 80 move into steady conditions in a relatively short time.

It should be noted that the operational amplifier 80 may be replaced by a comparator. In this case, offset voltage correction for the comparator is implemented.

What is claimed is:

1. An offset voltage correction circuit for an operational amplifier having a phase compensation capacitor, the circuit comprising:

a switch element which disconnects the phase compensation capacitor from a remaining portion of the operational amplifier to enable the operational amplifier to serve as a comparator;

an offset voltage varying element which varies an offset voltage in the operational amplifier in response to an offset voltage control value; and a control element which outputs the offset voltage control value to the offset voltage varying element, changes the offset voltage control value, stores a digital signal representative of the offset voltage control value at which an output level from the operational amplifier changes, and corrects the offset voltage in the operational amplifier in response to the stored digital signal.

2. An offset voltage correction circuit as recited in claim 1, wherein the switch element comprises switches connected to opposite ends of the phase compensation capacitor respectively.

3. An offset voltage correction circuit for an operational amplifier comprising:

an offset voltage varying element which varies an offset voltage in the operational amplifier in response to an offset voltage control value;

a comparing element which compares an output voltage from the operational amplifier with a prescribed reference voltage; and a control element which outputs the offset voltage control value to the offset voltage varying element to change the offset voltage control value, and which stores, in response to a result of the comparing by the comparing element, a digital signal representative of the offset voltage control value that occurs when the output voltage from the operational amplifier and the prescribed reference voltage are equal, and which corrects the offset voltage in the operational amplifier in response to the stored digital signal, wherein the offset voltage varying element comprises:

a first transistor connected to a non-inverting input portion of the operational amplifier, the non-inverting input portion having a non-inverting input terminal of the operational amplifier;

a second transistor connected to an inverting input portion of the operational amplifier, the inverting input portion having an inverting input terminal of the operational amplifier;

a digital-to-analog converter for generating a voltage in response to the offset voltage control value outputted from the control means; and a constant voltage generator which generates a constant voltage;

wherein the voltage generated by the digital-to-analog converter is applied to a gate of one of the first and second transistors, and the constant voltage is applied to a gate of the other of the first and second transistors to vary the offset voltage in response to the voltage generated by the digital-to-analog converter.

4. An offset voltage correction circuit as recited in claim 3, wherein the control element comprises a counter for providing a count value being the offset voltage control value, and the voltage generated by the digital-to-analog converter depends on the count value provided by the counter.

5. An offset voltage correction circuit as recited in claim 3, wherein the voltage generated by the digital-to-analog converter monotonically varies in accordance with the count value provided by the counter;

one of a maximum value and a minimum value of the voltage generated by the digital-to-analog converter is equal to the constant voltage;

and the counter operates to change an offset corrective amount from an upper limit value to an intermediate value, and then exchange the voltages applied to the gates of the first and second transistors and change the offset corrective amount from the intermediate value to a lower limit value.

6. An offset voltage correction circuit as recited in claim 3, wherein the control element comprises:

a first counter which provides a count value corresponding to the offset voltage control value, and a second counter which provides a count value corresponding to the offset voltage control value;

a digital-to-analog converter which selects one of the count values provided by the first and second counters and generates a voltage in response to the selected count value, wherein, during offset voltage detection, the digital-to-analog converter selects the count value provided by the first counter, and the voltages applied to the gates of the transistors are exchanged when the count value provided by the first counter, which operates in an up count mode, reaches an upper limit value, and the first counter operates in a down count mode until the count value provided by the first counter reaches a lower limit value;

the second counter implementing counting in response to the result of the comparing by the comparing element, wherein the second counter stores the count value provided by the second counter and after the offset voltage detection ends, the digital-to-analog converter selects the count value provided by the second counter, and the digital-to-analog converter generates a voltage in response to the count value stored by the second counter.

7. An offset voltage correction circuit as recited in claim 3, wherein the control element comprises a register for controlling the offset voltage control value outputted to the digital-to-analog converter.

8. An offset voltage correction circuit for an operational amplifier including an output terminal, the circuit comprising:

an offset voltage varying element which varies an offset voltage in the operational amplifier in response to an offset voltage control value;

a comparing element which compares an output voltage from the operational amplifier with a prescribed reference voltage;

a control element which outputs the offset voltage control value to the offset voltage varying element, changes the offset voltage control value, stores, in response to a result of the comparing by the comparing element, a digital signal representative of the offset voltage control value which occurs when the output voltage from the operational amplifier and the prescribed reference voltage are equal to each other and corrects the offset voltage in the operational amplifier in response to the stored digital signal;

a switch element;

an output holding circuit connected to the output terminal of the operational amplifier via the switch element which holds the output voltage from the operational amplifier;

an element which turns off the switch element, during a sampling process, to output the output voltage from the operational amplifier (1); and an element which turns off the switch element, during a hold process, to output the output voltage from the operational amplifier which occurs immediately before the switch element is turned off.

9. An offset voltage correction circuit for an operational amplifier, comprising:
- a first element which applies a prescribed reference voltage to an input terminal of the operational amplifier;
- a second element which applies an offset corrective voltage to the operational amplifier;
- a third element which generates a digital signal, and periodically updates the generated digital signal;
- a fourth element which varies the offset corrective voltage applied to the operational amplifier in response to the digital signal;
- a fifth element which compares an output voltage from the operational amplifier with the prescribed reference voltage applied to the input terminal of the operational amplifier to detect that the output voltage from the operational amplifier reaches the prescribed reference voltage while the fourth element varies the offset corrective voltage;
- a sixth element which inhibits the third element which updates the digital signal when the fifth element detects that the output voltage from the operational amplifier reaches the prescribed reference voltage; and
- a seventh element which stores the digital signal generated by the third element when the sixth element inhibits the third element, and outputs the stored digital signal to the fourth element.

10. An offset voltage correction circuit for an operational amplifier, comprising:
- a first element which applies a prescribed reference voltage to an input terminal of the operational amplifier;
- a second element which applies an offset corrective voltage to the operational amplifier;
- a signal generator for generating a clock pulse signal;
- a counter connected to the signal generator for counting pulses of the clock pulse signal, and generating a digital signal representative of a result of the counting;
- a third element which varies the offset corrective voltage applied to the operational amplifier in response to the digital signal;
- a fourth element which compares an output voltage from the operational amplifier with the prescribed reference voltage applied to the input terminal of the operational amplifier to detect that the output voltage from the operational amplifier reaches the prescribed reference voltage while the element varies the offset corrective voltage; and
- a fifth element which blocks feed of the clock pulse signal from the signal generator to the counter when the fourth element detects that the output voltage from the operational amplifier reaches the prescribed reference voltage.

* * * * *